(12) United States Patent
Hirota

(10) Patent No.: US 11,006,059 B2
(45) Date of Patent: May 11, 2021

(54) IMAGING DEVICE, DRIVING METHOD, AND ELECTRONIC APPARATUS

(71) Applicant: SONY SEMICONDUCTOR SOLUTIONS CORPORATION, Kanagawa (JP)

(72) Inventor: Isao Hirota, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/842,436

(22) Filed: Apr. 7, 2020

(65) Prior Publication Data

US 2020/0236308 A1    Jul. 23, 2020

Related U.S. Application Data

(63) Continuation of application No. 16/286,385, filed on Feb. 26, 2019, now Pat. No. 10,674,100, which is a
(Continued)

(30) Foreign Application Priority Data

Feb. 13, 2015  (JP) .................................. 2015-026497

(51) Int. Cl.
*H04N 5/355* (2011.01)
*H01L 27/146* (2006.01)
(Continued)

(52) U.S. Cl.
CPC ..... *H04N 5/3559* (2013.01); *H01L 27/14605* (2013.01); *H01L 27/14612* (2013.01);
(Continued)

(58) Field of Classification Search
CPC ................ H04N 5/3559; H04N 5/3592; H01L 27/14623; H01L 27/14656
See application file for complete search history.

(56) References Cited

U.S. PATENT DOCUMENTS

2004/0051801 A1   3/2004  Iizuka et al.
2005/0012168 A1   1/2005  Hong
(Continued)

FOREIGN PATENT DOCUMENTS

JP    05-268533 A     10/1993
JP    2004-111590 A    4/2004
(Continued)

OTHER PUBLICATIONS

Non-Final Office Action for U.S. Appl. No. 16/286,385, dated Jul. 10, 2019, 22 pages.
(Continued)

*Primary Examiner* — Ahmed A Berhan
(74) *Attorney, Agent, or Firm* — Chip Law Group

(57) ABSTRACT

The present disclosure relates to an imaging device, a driving method, and an electronic apparatus that can capture an image with a higher dynamic range. The imaging device includes a pixel region in which pixels are arranged, the pixels each including a photoelectric conversion unit that converts incident light into electric charges through electric conversion and stores the electric charges, and two or more charge storage units that store the electric charges transferred from the photoelectric conversion unit; and a drive unit that drives the pixels. The drive unit drives each pixel to cause the photoelectric conversion unit to repeatedly transfer electric charges with different exposure times to the two or more charge storage units during the light reception
(Continued)

period of one frame. The present technology can be applied to an imaging device capable of capturing an HDR image, for example.

5 Claims, 20 Drawing Sheets

Related U.S. Application Data continuation of application No. 15/546,496, filed as application No. PCT/JP2016/052592 on Jan. 29, 2016, now Pat. No. 10,264,197.

(51) Int. Cl.
  *H04N 5/359* (2011.01)
  *H04N 5/3745* (2011.01)
  *H04N 5/378* (2011.01)

(52) U.S. Cl.
  CPC ....... *H04N 5/3592* (2013.01); *H04N 5/35554* (2013.01); *H04N 5/35563* (2013.01); *H04N 5/378* (2013.01); *H04N 5/3745* (2013.01); *H04N 5/37452* (2013.01); *H04N 5/37455* (2013.01); *H01L 27/14623* (2013.01); *H01L 27/14656* (2013.01)

(56) References Cited

U.S. PATENT DOCUMENTS

| | | | | |
|---|---|---|---|---|
| 2008/0018763 | A1* | 1/2008 | Sato | H04N 5/335 348/308 |
| 2009/0002528 | A1 | 1/2009 | Manabe et al. | |
| 2011/0013064 | A1 | 1/2011 | Lahav et al. | |
| 2011/0032403 | A1* | 2/2011 | Mabuchi | H04N 5/35581 348/296 |
| 2013/0057754 | A1 | 3/2013 | Shimada et al. | |
| 2013/0135486 | A1* | 5/2013 | Wan | H04N 5/335 348/207.99 |
| 2014/0246561 | A1 | 9/2014 | Chen et al. | |

FOREIGN PATENT DOCUMENTS

| | | |
|---|---|---|
| JP | 2008-028678 A | 2/2008 |
| JP | 2013-055610 A | 3/2013 |
| JP | 5521682 B2 | 6/2014 |

OTHER PUBLICATIONS

Final Office Action for U.S. Appl. No. 16/286,385, dated Nov. 22, 2019, 13 pages.
Notice of Allowance for U.S. Appl. No. 16/286,385, dated Jan. 27, 2020, 09 pages.
Notice of Allowance for U.S. Appl. No. 16/286,385, dated Mar. 11, 2020, 03 pages.
Non-Final Office Action for U.S. Appl. No. 15/546,496, dated Mar. 29, 2018, 14 pages.
Final Office Action for U.S. Appl. No. 15/546,496, dated Sep. 18, 2018, 14 pages.
Notice of Allowance for U.S. Appl. No. 15/546,496, dated Nov. 30, 2018, 08 pages.
International Search Report and Written Opinion of PCT Application No. PCT/JP2016/052592, dated Mar. 15, 2016, 08 pages of English Translation and 07 pages of ISRWO.
International Preliminary Report on Patentability of PCT Application No. PCT/JP2016/052592, dated Aug. 24, 2017, 08 pages of English Translation and 04 pages of IPRP.
Office Action for JP Patent Application No. 2016-574723, dated Mar. 12, 2020, 05 pages of Office Action and 04 pages of English Translation.

\* cited by examiner

IMAGING DEVICE, DRIVING METHOD, AND ELECTRONIC APPARATUS

CROSS-REFERENCES TO RELATED APPLICATIONS

The present application is a continuation application of U.S. patent application Ser. No. 16/286,385, filed on Feb. 26, 2019, which is a continuation application of U.S. patent application Ser. No. 15/546,496, filed on Jul. 26, 2017, which is a National Stage Entry of PCT/JP2016/052592, filed on Jan. 29, 2016, which claims the benefit of priority from Japanese Patent Application No. JP 2015-026497, filed in the Japan Patent Office on Feb. 13, 2015. Each of the above-referenced applications is hereby incorporated herein by reference in its entirety.

TECHNICAL FIELD

The present disclosure relates to an imaging device, a driving method, and an electronic apparatus, and more particularly, to an imaging device, a driving method, and an electronic apparatus that can capture an image with a higher dynamic range.

BACKGROUND ART

In a conventional electronic apparatus having an imaging function, such as a digital still camera or a digital video camera, a solid-state imaging device like a charge coupled device (CCD) or a complementary metal oxide semiconductor (CMOS) image sensor is used. A solid-state imaging device has pixels each including a combination of a photodiode (PD) that performs photoelectric conversion and transistors, and an image is formed in accordance with pixel signals that are output from the pixels arranged in a two-dimensional fashion. Further, the pixel signals output from the pixels are subjected to AD conversion in parallel by analog-to-digital (AD) converters arranged for the respective columns of the pixels, for example, and the pixel signals are then output.

Also, there have been various recently suggested techniques for capturing a high dynamic range (HDR) image that has a dynamic range widened by an imaging method by which signals generated in different exposure times are combined.

For example, Patent Document 1 discloses a solid-state imaging device that drives a pixel including first and second charge storage units so that an electric charge equal to or smaller than the saturation charge amount of the first charge storage unit is stored in the first charge storage unit, and an electric charge exceeding the saturation charge amount of the first charge storage unit is stored in the first and second charge storage units. With this imaging device, it is possible to increase the HDR ratio while improving the signal-to-noise ratio (SNR), by performing HDR combining in three stages: low illuminance, medium illuminance, and large illuminance.

CITATION LIST

Patent Document

Patent Document 1: Japanese Patent No. 5521682

SUMMARY OF THE INVENTION

Problems to be Solved by the Invention

In the configuration disclosed in Patent Document 1, however, in a case where the installation area of the charge storage units is limited, the total capacity of electric charges that can be stored in the charge storage units cannot be increased, and therefore, only the two separate charge storage units are formed. Because of this, the dynamic range expansion rate of each charge storage unit becomes lower. Therefore, the expansion ratio in dynamic range cannot be improved, and it is difficult to capture an image with a higher dynamic range.

The present disclosure is made in view of those circumstances, and is to enable capturing of an image with a higher dynamic range.

Solutions to Problems

An imaging device according to one aspect of the present disclosure includes: a pixel region in which pixels are arranged, the pixels each including a photoelectric conversion unit that converts incident light into electric charges through electric conversion and stores the electric charges, and two or more charge storage units that store the electric charges transferred from the photoelectric conversion unit; and a drive unit that drives each pixel to cause the photoelectric conversion unit to repeatedly transfer electric charges with different exposure times to the two or more charge storage units during the light reception period of one frame.

A driving method according to one aspect of the present disclosure is a method of driving an imaging device that includes: a pixel region in which pixels are arranged, the pixels each including a photoelectric conversion unit that converts incident light into electric charges through electric conversion and stores the electric charges, and two or more charge storage units that store the electric charges transferred from the photoelectric conversion unit; and a drive unit that drives the pixels. The method includes repeatedly transferring electric charges with different exposure times from the photoelectric conversion unit to the two or more charge storage units during the light reception period of one frame, the drive unit causing the photoelectric conversion unit to repeatedly transfer electric charges.

An electronic apparatus according to one aspect of the present disclosure includes an imaging device that includes: a pixel region in which pixels are arranged, the pixels each including a photoelectric conversion unit that converts incident light into electric charges through electric conversion and stores the electric charges, and two or more charge storage units that store the electric charges transferred from the photoelectric conversion unit; and a drive unit that drives each pixel to cause the photoelectric conversion unit to repeatedly transfer electric charges with different exposure times to the two or more charge storage units during the light reception period of one frame.

In one aspect of the present disclosure, electric charges with different exposure times are repeatedly transferred from a photoelectric conversion unit to two or more electric charge storage units during the light reception period of one frame.

Effects of the Invention

According to one aspect of the present disclosure, an image with a higher dynamic range can be captured.

MODES FOR CARRYING OUT THE INVENTION

The following is a detailed description of specific embodiments to which the present technology is applied, with reference to the drawings.

Figure 1:
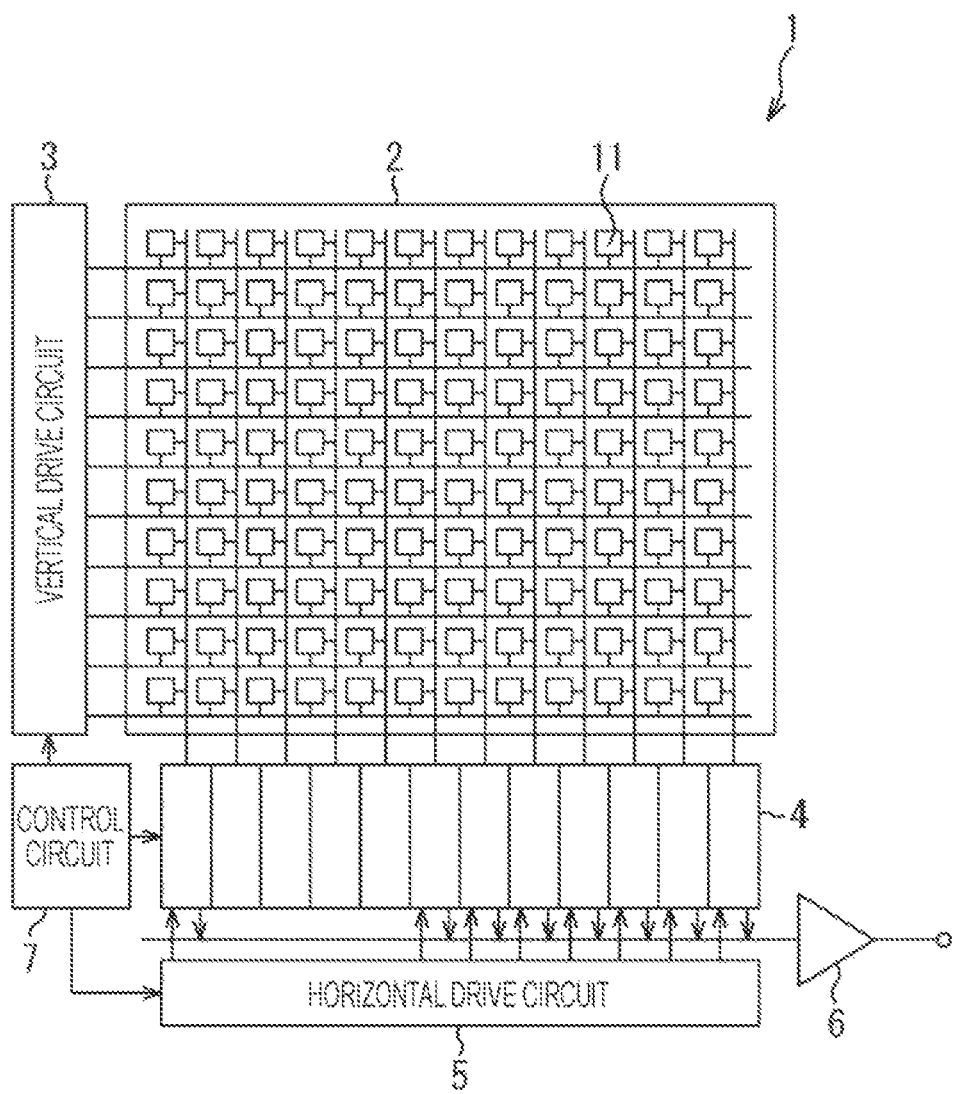
FIG. 1 is a block diagram showing an example configuration of an embodiment of an imaging device to which the present technology is applied.

FIG. 1 is a block diagram showing an example configuration of an embodiment of an imaging device to which the present technology is applied.

As shown in FIG. 1, an imaging device 1 includes a pixel region 2, a vertical drive circuit 3, a column signal processing circuit 4, a horizontal drive circuit 5, an output circuit 6, and a control circuit 7.

The pixel region 2 is a light receiving surface for receiving light condensed by an optical system (not shown). In the pixel region 2, pixels 11 are arranged in a matrix fashion.

The pixels 11 are connected to the vertical drive circuit 3 via horizontal signal lines row by row, and are also connected to the column signal processing circuit 4 via vertical signal lines column by column. The pixels 11 each output a pixel signal at the level corresponding to the amount of received light, and an image of the object to be formed in the pixel region 2 is formed from these pixel signals.

For each row of the pixels 11 arranged in the pixel region 2, the vertical drive circuit 3 sequentially supplies drive signals for driving (or transferring signals to, selecting, resetting, or the like) the respective pixels 11, to the pixels 11 via the horizontal signal lines.

The column signal processing circuit 4 conduct AD conversion on an image signal and removes reset noise by performing correlated double sampling (CDS) on the pixel signals output from the respective pixels 11 via the vertical signal lines.

For each column of the pixels 11 arranged in the pixel region 2, the horizontal drive circuit 5 sequentially supplies drive signals for outputting the pixel signals from the column signal processing circuit 4 to data output signal lines, to the column signal processing circuit 4.

The output circuit 6 amplifies pixel signals supplied from the column signal processing circuits 4 at the times in accordance with the drive signals from the horizontal drive circuit 5 via the data output signal lines, and outputs the amplified pixel signals to a signal processing circuit in a later stage.

The control circuit 7 controls driving of the respective blocks in the imaging device 1. For example, the control circuit 7 generates clock signals in accordance with the drive cycles of the respective blocks, and supplies the clock signals to the respective blocks.

In the imaging device 1 having the above configuration, each pixel 11 is designed to include charge storage units so that a moving image as an HDR image can be captured, and electric charges of different exposure times are stored in the charge storage units.

Figure 2:
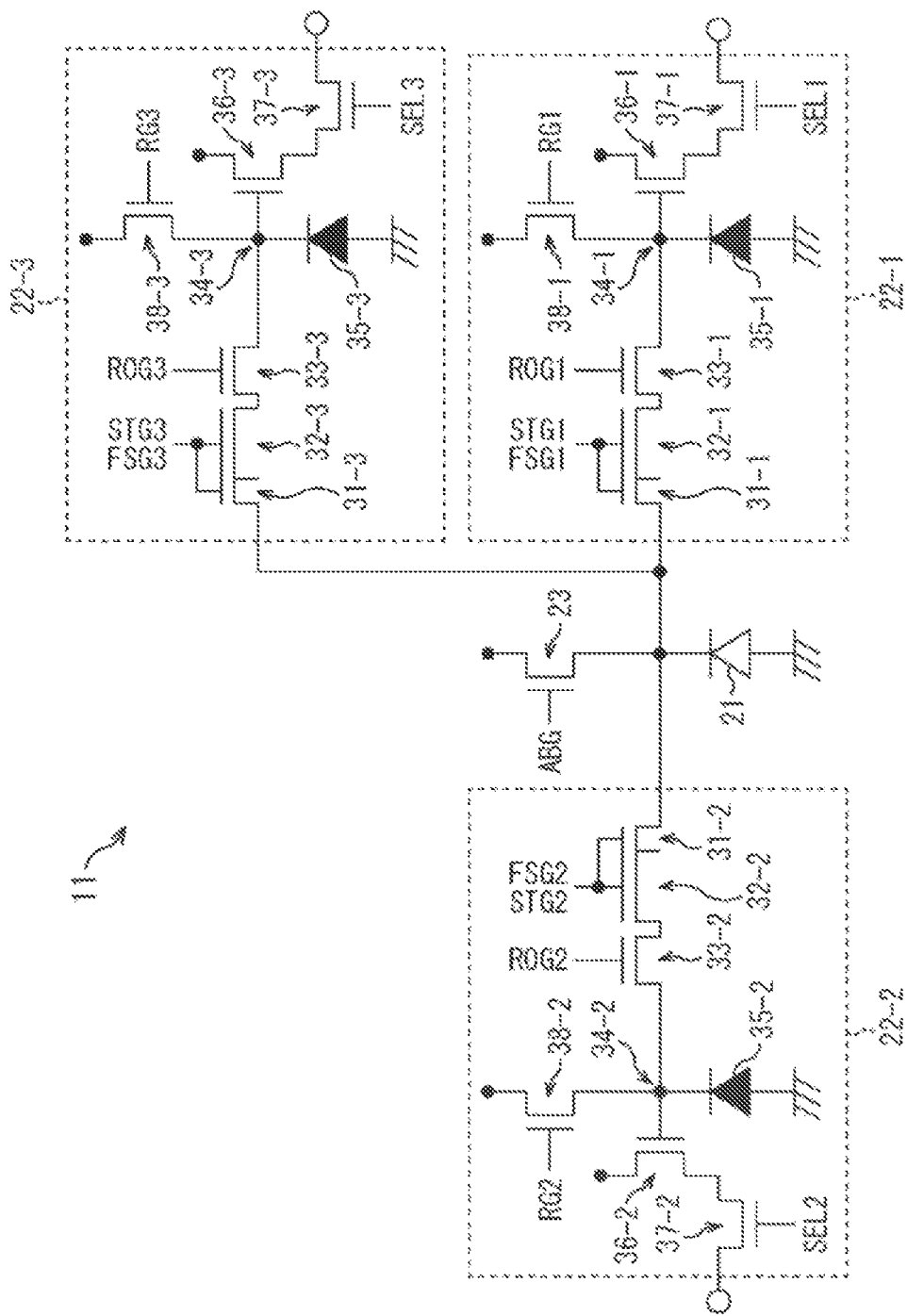
FIG. 2 is a circuit diagram showing a first configuration example of a pixel.
Figure 3:
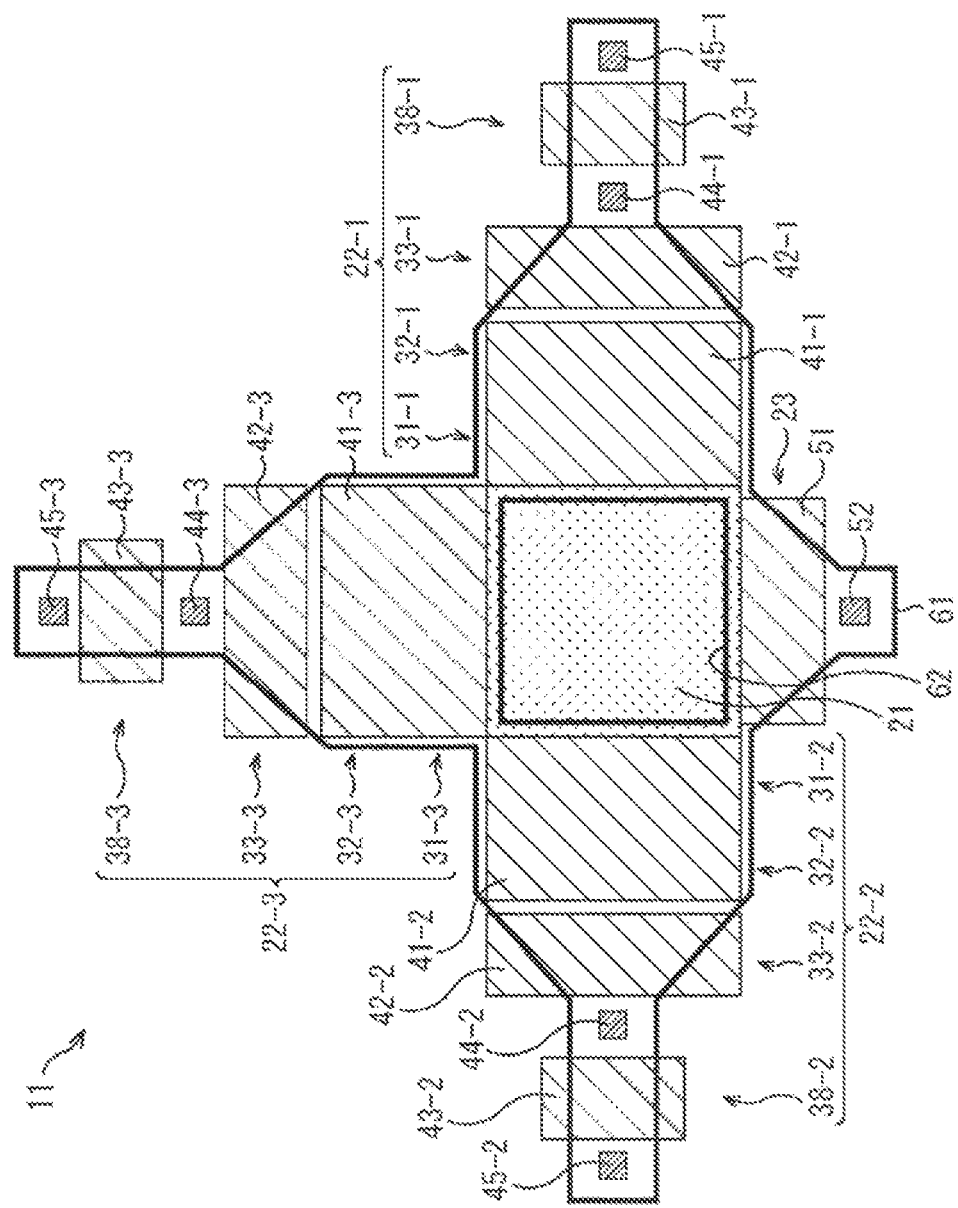
FIG. 3 is a diagram showing a planar configuration example of the pixel of the first configuration example.
Figure 4:
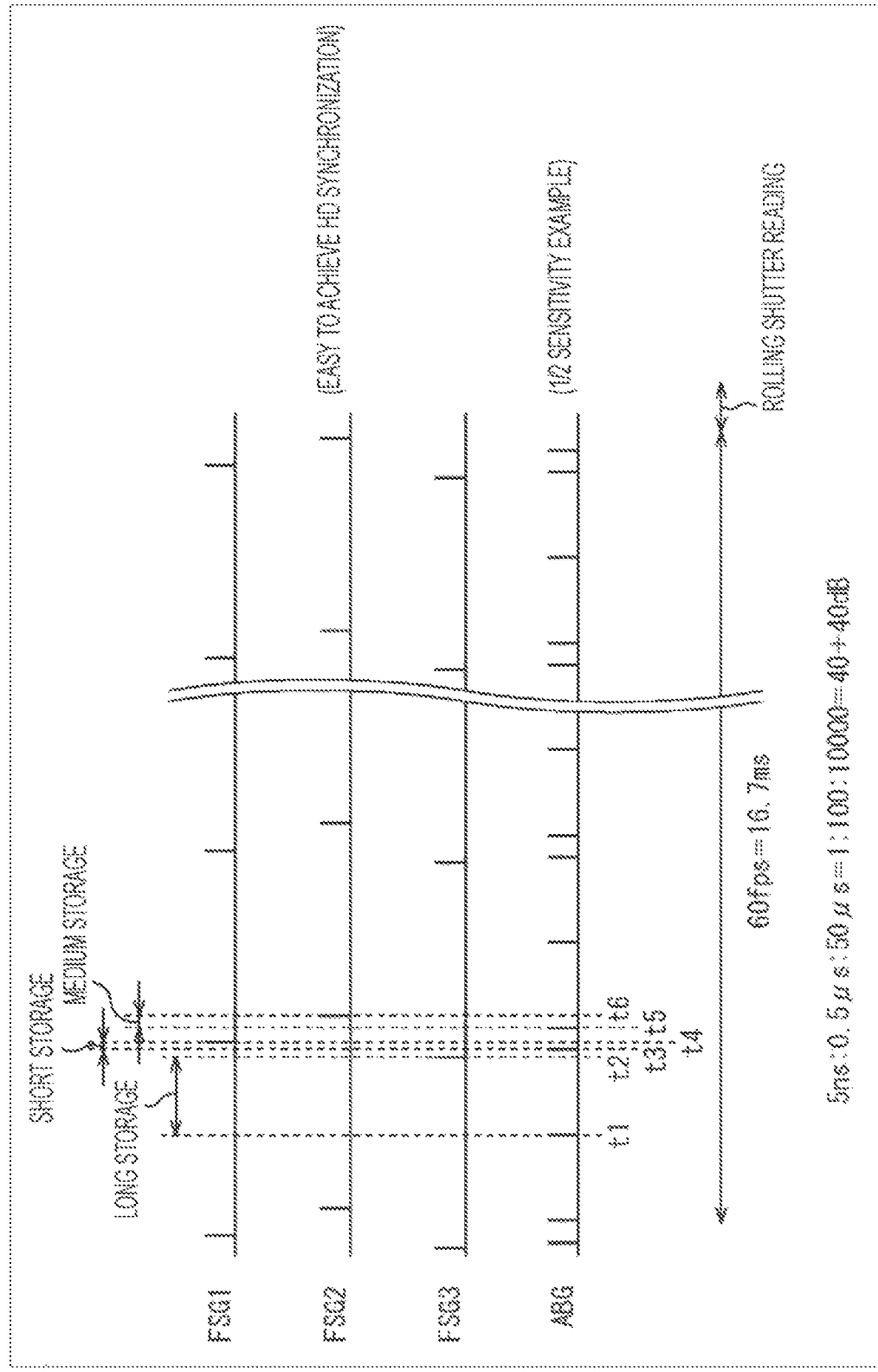
FIG. 4 is a diagram for explaining a method of driving an imaging device including pixels of the first configuration example.

Referring now to FIGS. 2 to 4, a first configuration example of a pixel 11 and a driving method are described.

FIG. 2 is a circuit diagram showing the first configuration example of a pixel 11.

As shown in FIG. 2, a pixel 11 is designed to include a PD 21, charge readout paths 22-1 to 22-3, and an anti-blooming gate 23.

The PD 21 is a photoelectric conversion unit that converts incident light into an electric charge through photoelectric conversion, and stores the electric charge. The anode terminal of the PD 21 is grounded, and the cathode terminal of the PD 21 is connected to the vertical signal line via the charge readout paths 22-1 to 22-3, and is also connected to the drain via the anti-blooming gate 23.

The charge readout path 22-1 includes a transfer gate 31-1, a charge storage gate 32-1, a readout gate 33-1, an FD unit 34-1, a storage capacitor 35-1, an amplification transistor 36-1, a select transistor 37-1, and a reset transistor 38-1. It should be noted that the charge readout paths 22-2 and 22-3 each have a configuration similar to that of the charge readout path 22-1, and therefore, detailed explanation thereof is not made herein.

The gate electrode of the transfer gate 31-1 and the gate electrode of the charge storage gate 32-1 are connected, and the transfer gate 31-1 and the charge storage gate 32-1 are driven at the same time in accordance with a transfer pulse FSG1/STG1 applied to the gate electrodes. That is, at a time when the transfer pulse FSG1/STG1 switches to "on", the electric charge stored in the PD 21 is transferred to the charge storage gate 32-1 via the transfer gate 31-1, and is stored in the charge storage gate 32-1.

The readout gate 33-1 is driven in accordance with a readout pulse ROG1 applied to the gate electrode, and at a time when the readout pulse ROG1 switches to "on", the electric charge stored in the charge storage gate 32-1 is read and output to the FD unit 34-1.

The FD unit 34-1 is a floating diffusion region having the predetermined storage capacitor 35-1 connected to the gate electrode of the amplification transistor 36-1, and temporarily stores the electric charge transferred via the readout gate 33-1 into the storage capacitor 35-1.

The amplification transistor 36-1 outputs a pixel signal at the level corresponding to the electric charge stored in the storage capacitor 35-1 of the FD unit 34-1 (or the potential of the FD unit 34-1), to the vertical signal line via the select transistor 37-1. That is, the FD unit 34-1 is connected to the gate electrode of the amplification transistor 36-1, so that the FD unit 34-1 functions as a charge-voltage conversion unit that converts the electric charge transferred from the PD 21 to the charge storage gate 32-1, into a pixel signal at the level corresponding to the electric charge.

The select transistor 37-1 is driven by a select signal SEL1 supplied from the vertical drive circuit 3. When the select transistor 37-1 is switched on, the pixel signal to be output from the amplification transistor 36-1 can be output to the vertical signal line.

The reset transistor 38-1 is driven by a reset signal RG1 supplied from the vertical drive circuit 3. When the reset transistor 38-1 is switched on, the electric charge stored in the storage capacitor 35-1 of the FD unit 34-1 is discharged to the drain. As a result, the storage capacitor 35-1 of the FD unit 34-1 is reset.

The charge readout path 22-1 has the above configuration, and a pixel signal corresponding to the electric charge transferred from the PD 21 to the charge storage gate 32-1 is read out via the charge readout path 22-1. Likewise, in the charge readout path 22-2, a pixel signal corresponding to the electric charge transferred from the PD 21 to the charge storage gate 32-2 is read out. In the charge readout path 22-3, a pixel signal corresponding to the electric charge transferred from the PD21 to the charge storage gate 32-3 is read out.

The anti-blooming gate 23 is driven in accordance with a discharge pulse ABG applied to the gate electrode, and, at a time when the discharge pulse ABG switches to "on", the electric charge stored in the PD 21 is discharged to the drain. In this manner, shutter control is performed. Further, the potential of the anti-blooming gate 23 is set so that electric charge overflows from the PD 21 via the anti-blooming gate 23 in a case where extremely intense light enters the PD 21.

The pixel 11 designed as above can read out the electric charge generated in the PD 21 via the charge readout paths 22-1 to 22-3, in accordance with driving of the vertical drive circuit 3 shown in FIG. 1. Accordingly, during the light reception period of one frame, the pixel 11 can sequentially transfer the electric charge in the PD 21 to the charge storage gate 32-1, the charge storage gate 32-2, and the charge storage gate 32-3, and thus, store electric charges (pixel signals) of three different exposure times. Further, by such a driving method, the imaging device 1 can obtain pixel signals of different exposure times from one another.

For example, the imaging device 1 drives the pixel 11 by such a driving method that an electric charge with a short storage time (hereinafter referred to as short storage, where appropriate) is transferred to the charge storage gate 32-1, an electric charge with a medium storage time (hereinafter referred to as medium storage, where appropriate) is transferred to the charge storage gate 32-2, and an electric charge with a long storage time (hereinafter referred to as long storage, where appropriate) is transferred to the charge storage gate 32-3. In this operation, driving is performed so that the timing of supplying the transfer pulse FSG/STG for transferring an electric charge is set to a period sufficiently shorter than one frame, and charge transfer to the charge storage gate 32-1, the charge storage gate 32-2, and the charge storage gate 32-3 is repeatedly performed (this driving method will be hereinafter referred to as the burst distribution driving, where appropriate).

Further, in the imaging device 1, after the electric charges of one frame are stored, the pixel signals corresponding to the electric charges transferred to the charge storage gate 32-1, the charge storage gate 32-2, and the charge storage gate 32-3 are read out, and HDR combining is performed. As a result, an HDR image with a sufficiently wide dynamic range can be obtained. For example, the exposure ratios among the electric charges to be transferred to the charge storage gate 32-1, the charge storage gate 32-2, and the charge storage gate 32-3 are set to 1 (60 dB): 32(+30 dB): 1000(+30 dB), so that the imaging device 1 can obtain an HDR image of 120 dB.

The exposure ratios among the electric charges to be transferred to the charge storage gate 32-1, the charge storage gate 32-2, and the charge storage gate 32-3 are now described.

For example, in the imaging device 1, it is necessary to maintain 120 dB in order to cover the light range from moonlight to sunlight. As the size of the imaging device 1 has been becoming smaller and smaller these days, the saturation charge amounts of the PD 21, the charge storage gate 32, and the like are less than 10,000 electrons. Meanwhile, several electrons of dark current and circuit noise remain within the actual operation temperature range, and the dynamic range of one PD 21 or one charge storage gate 32 is approximately 20 LOG (10000 e/10 e)=approximately 60 dB, for example.

Further, in a case where HDR combining is performed with images having sensitivity differences, if a high-illuminance image is to be generated at a noise level of several electrons, the SNR difference becomes too wide at the portion to be combined with a high-SNR image having a low-saturation signal on the low-illuminance side, resulting in image destruction.

Therefore, among signals on the high-illuminance side, only signals equal to or higher than a certain SNR can be normally used in HDR combining. For example, where the visually acceptable level is about 20 dB, the amount that can be used in expanding the dynamic range on the high-illuminance side is +40 dB, instead of +60 dB. Therefore, a DR=(60+40)=100 dB is achieved with two signals, and, with such a DR, it is not possible to achieve 120 dB to cover the light range from moonlight to sunlight.

In view of this, three charge storage gates 32-1 to 32-3 are used in the imaging device 1, to set a DR at (60+40+40)=140 dB. Thus, the goal to cover the light range from moonlight to sunlight can be achieved.

Next, FIG. 3 shows an example planar configuration of the pixel 11 shown in FIG. 2.

As shown in FIG. 3, in the pixel 11, the charge readout paths 22-1 to 22-3 are designed to be connected to three sides of the PD 21 formed in a substantially square shape, and the anti-blooming gate 23 is designed to be connected to the remaining one side of the PD 21.

In the charge readout path 22-1, the transfer gate 31-1, the charge storage gate 32-1, the readout gate 33-1, and the reset transistor 38-1 are arranged in order from the PD 21 side. It should be noted that the charge readout paths 22-2 and 22-3 each have a configuration similar to that of the charge readout path 22-1, and therefore, detailed explanation thereof is not made herein. Also, in FIG. 3, the amplification transistor 36 and the select transistor 37 are not shown.

The transfer gate 31-1 and the charge storage gate 32-1 are designed to have a common gate electrode 41-1, and the gate electrode 41-1 is disposed adjacent to the PD 21. Also, a through electrode 44-1 connected to the FD unit 34 is disposed between a gate electrode 42-1 forming the readout gate 33-1 and a gate electrode 43-1 forming the reset transistor 38-1. Further, a through electrode 45-1 connected to the drain of the reset transistor 38-1 is disposed on the opposite side of the gate electrode 43-1 from the through electrode 44-1.

In the anti-blooming gate 23, a gate electrode 51-1 is disposed adjacent to the PD 21, and a through electrode 52 connected to the drain is disposed on the opposite side of the gate electrode 51-1 from the PD 21.

Meanwhile, on the light receiving surface side of the pixel 11, a light shielding film 61 is formed to shield light from the charge readout paths 22-1 to 22-3 and the anti-blooming gate 23. The light shielding film 61 is provided with an opening 62 for guiding light into the PD 21.

As described above, the pixel 11 is designed so that the charge readout paths 22-1 to 22-3 are arranged in three directions (a 3-tap structure), and the anti-blooming gate 23 is arranged in the remaining one direction. With such a configuration, the pixel 11 can read electric charges of different exposure times via the charge readout paths 22-1 to 22-3, as described above.

It should be noted that, as shown in FIGS. 2 and 3, the pixel 11 employs the charge storage gates 32-1 to 32-3 each having a buried-channel-type structure provided with a gate electrode as the charge storage units that store electric charges transferred from the PD 21. Moreover, the pixel 11 can employ charge storage units of various structure types, such as a floating diffusion type or a buried-channel type provided with a virtual gate. In such a case, the capacity of these charge storage units can be set in accordance with the dynamic range ratio or the SNR. Also, as the dynamic range of the pixel 11 can be widened, the pixel 11 may not include the anti-blooming gate 23. Further, it is possible to employ a FD sharing structure that has been widely used for miniaturization in recent years. In such a structure, an FD unit 34 and the circuits in the later stages can be shared. Specifically, the FD unit 34-1, the FD unit 34-2, and the FD unit 34-3 are connected to form one FD unit, and the FD unit is shared among a reset transistor 38, an amplification transistor 36, a select transistor 37, and charge readout paths 22-1 to 22-3. Such a structure can also be employed.

Referring now to FIG. 4, a method of driving the imaging device 1 is described.

For example, where the frame rate at which the imaging device 1 captures a moving image is 60 fps, the exposure time per frame is 16.7 ms. Then, after finishing imaging of one frame, the imaging device 1 sequentially performs rolling shutter reading row by row.

In the example shown in FIG. 4, electric charges are transferred from the PD 21 in the following order: long storage transfer to the charge storage gate 32-3, short storage transfer to the charge storage gate 32-1, and medium storage transfer to the charge storage gate 32-2. Then, in the imaging device 1, the charge exposure time per charge transfer operation to be performed multiple times for the charge storage gate 32-3, the charge storage gate 32-1, and the charge storage gate 32-2 is set at a sufficiently shorter time than the exposure time of one frame, and long storage transfer, short storage transfer, and medium storage transfer are repeatedly performed in one frame. Here, the exposure times for the long storage, the short storage, and the medium storage to be transferred to the charge storage gate 32-3, the charge storage gate 32-1, and the charge storage gate 32-2, respectively, are substantially constant in each of the charge storage gate 32-3, the charge storage gate 32-1, and the charge storage gate 32-2.

First, as shown in the drawing, exposure for the long storage is started at the time when the discharge pulse ABG switches to "on" at time t1, and the electric charges stored in the PD 21 are discharged via the anti-blooming gate 23. Then, at time t2, the transfer pulse FSG3 switches to "on", and the long storage is transferred from the PD 21 to the charge storage gate 32-3 and is stored therein.

After that, at time t3, the discharge pulse ABG switches to "on", and exposure for the short storage is started. At time t4, the transfer pulse FSG1 switches to "on", and the short storage is transferred from the PD 21 to the charge storage gate 32-1 and is stored therein.

Subsequently, at time t5, the discharge pulse ABG switches to "on", and exposure for the medium storage is started. At time t6, the transfer pulse FSG2 switches to "on", and the medium storage is transferred from the PD 21 to the charge storage gate 32-2 and is stored therein.

Thereafter, such transfer of the long storage, the short storage, and the medium storage between time t1 and time t6 is repeatedly performed in a similar manner during one frame. For example, where the ratio among the exposure times for the short storage, the medium storage, and the long storage is set at 5 ns: 0.5 µs: 50 µs=1:100:10000, the imaging device 1 can obtain an HDR image with (40+40) dB.

It should be noted that FIG. 4 shows an example where imaging is performed with a sensitivity of ½ of the maximum sensitivity of the pixel 11.

For example, the exposure time for the long storage (the period from time t1 to time t2) is determined by setting time t1 within the period from the time when the transfer pulse FSG2 switches to "on" immediately before time t1, to the time when the transfer pulse FSG3 switches to "on" at time t2. In a case where the exposure time for the long storage is the maximum (maximum sensitivity), time t1 should be set at the same time as the time when the transfer pulse FSG2 switches to "on" immediately before that, and exposure for the long storage should be then started. In the example shown in FIG. 4, time t1 is set at such a time that the period becomes ½. Alternatively, to maximize the exposure time, all the discharge driving for the discharge pulse ABG may be turned off.

Likewise, in the example shown in FIG. 4, as for the exposure time for the short storage (the period from time t3 to time t4), time t3 is set at such a time that the period from time t2 to time t4 becomes ½. Also, as for the exposure time for the medium storage (the period from time t5 to time t6), time t5 is set at such a time that the period from time t4 to time t6 becomes ½. Further, the transfer pulses FSG1 to FSG3 and the discharge pulse ABG are set so as to be synchronized with one line in the rolling shutter reading. In this manner, the synchronous circuit design can be simplified.

By the driving method described above, the imaging device 1 can generate three images with different exposure times and perform HDR combining, simply by controlling the timing of transferring electric charges in the pixels 11. In doing so, for example, the imaging device 1 can perform the combining even if the amount of the electric charge in the short storage is small, and improve the SNR in the stage of the HDR combining. Thus, the imaging device 1 can obtain an HDR image with less noise.

As described above, the imaging device 1 is designed to include two or more charge storage gates for the single PD 21, and include the three charge storage gates 32-1 to 32-3 in the configuration example shown in FIG. 2. The imaging device 1 also performs burst distribution driving, to control the exposure time ratio in an HDR image. As described above, by distributing the transfer of electric charges to the charge storage gates 32-1 to 32-3 in a time-division manner, the imaging device 1 can certainly capture an image with a high dynamic range.

Further, as the imaging device 1 has a structure using the single PD 21, sensitivity loss can be reduced. Accordingly, the SNR at a low illuminance can be improved, while a high dynamic range is achieved. Thus, an HDR image of higher image quality can be captured.

Figure 5:
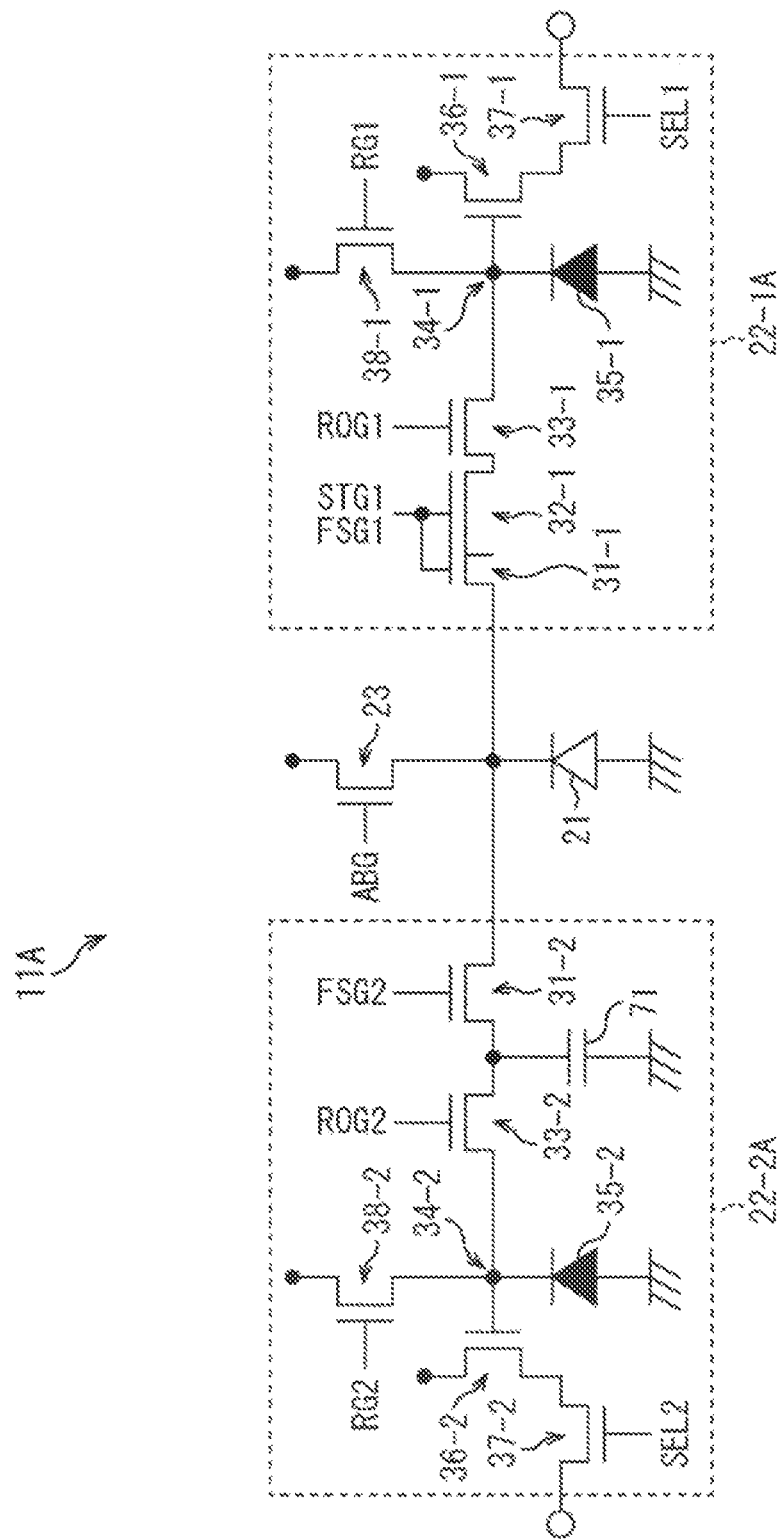
FIG. 5 is a circuit diagram showing a second configuration example of a pixel.
Figure 6:
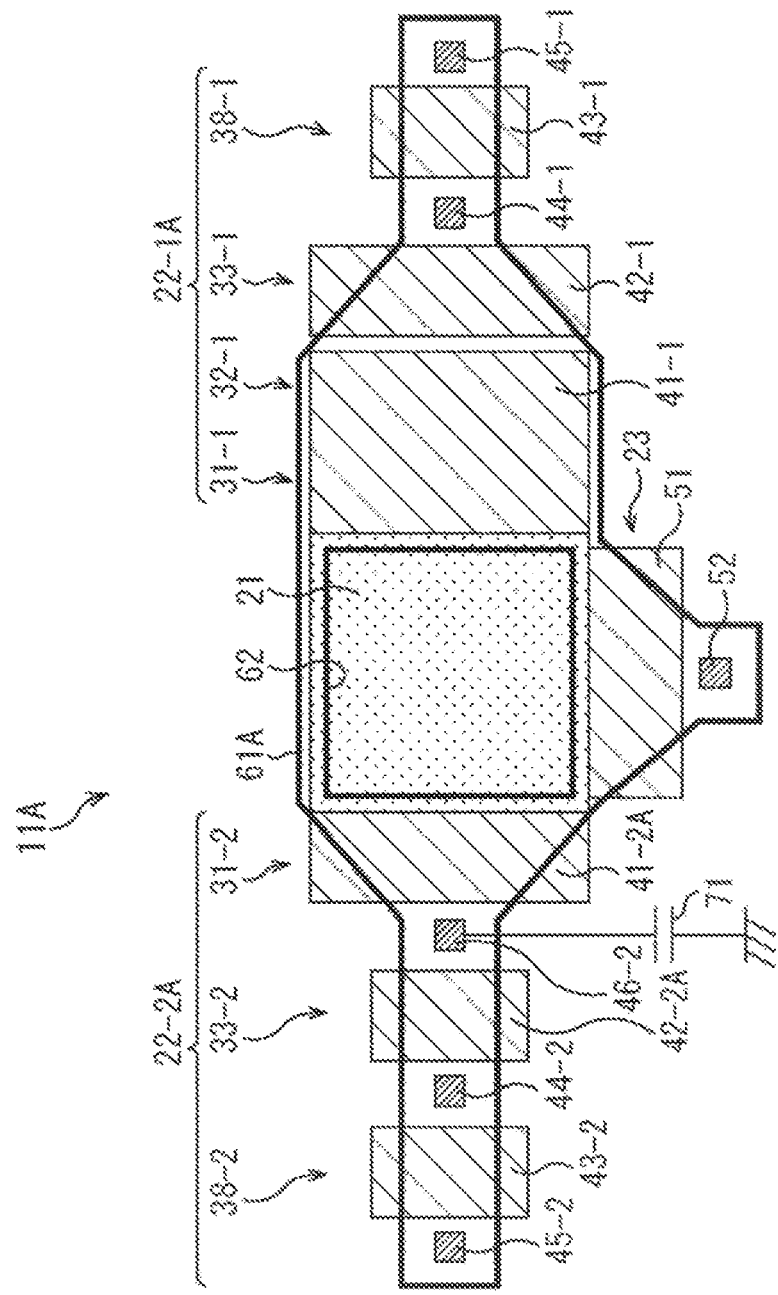
FIG. 6 is a diagram showing a planar configuration example of the pixel of the second configuration example.
Figure 7:
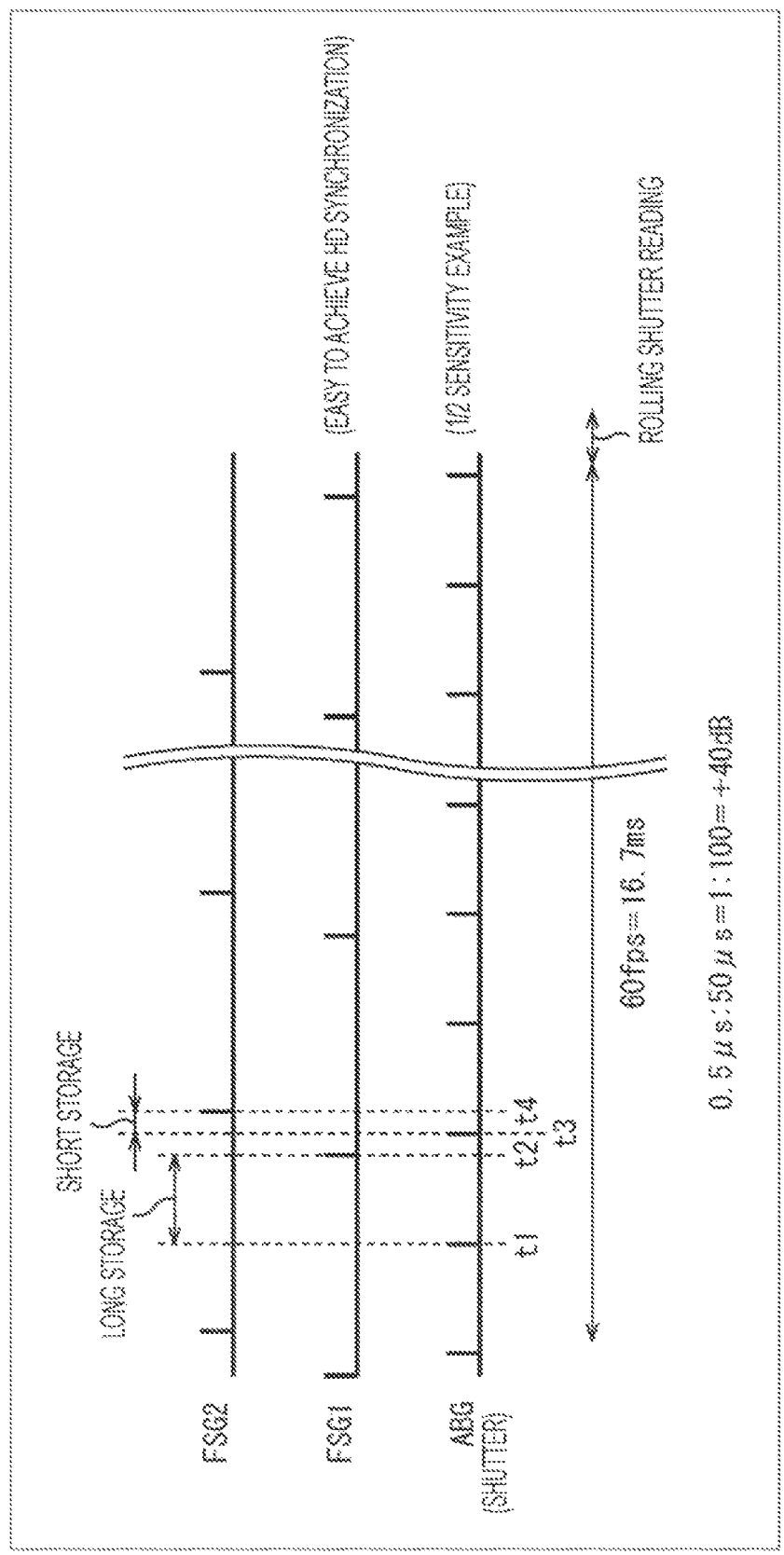
FIG. 7 is a diagram for explaining a method of driving an imaging device including pixels of the second configuration example.

Referring now to FIGS. 5 to 7, a second configuration example of a pixel 11 and a driving method are described.

FIG. 5 shows a circuit diagram of a pixel 11A as the second configuration example. FIG. 6 shows a planar configuration example of the pixel 11A.

As shown in FIGS. 5 and 6, the pixel 11A includes a PD 21, charge readout paths 22-1A and 22-2A, and an anti-blooming gate 23. It should be noted that the PD 21, the charge readout path 22-1A, and the anti-blooming gate 23 have configurations similar to those of the pixel 11 shown in FIG. 2, and therefore, detailed explanation thereof is not made herein.

That is, while the pixel 11 in FIG. 2 has the three charge readout paths 22-1 to 22-3, the pixel 11A has the two charge readout paths 22-1A and 22-2A, and the configuration of the charge storage path 22-2A differs from that of the corresponding charge storage path of the pixel 11 in FIG. 2.

The charge readout path 22-2A includes a transfer gate 31-2, a capacitor 71, a readout gate 33-2, an FD unit 34-2, a storage capacitor 35-2, an amplification transistor 36-2, a select transistor 37-2, and a reset transistor 38-2. As described above, the charge readout path 22-2A differs from the charge readout path 22-2 in FIG. 2 in that the charge storage gate 32-2 is replaced with the capacitor 71 that extends through a diffusion junction and is connected via a through electrode 46-2.

In the pixel 11A having such a configuration, an electric charge in the PD 21 is transferred to the capacitor 71 via the transfer gate 31-2, and is stored therein. That is, the pixel 11A is designed to employ a capacitor-type charge storage unit, instead of a buried-channel-type charge storage unit, as the charge storage unit in the charge readout path 22-2A.

With this configuration, the pixel 11A can make the storage capacity of the capacitor 71 in the charge readout path 22-2A larger than that of the charge storage gate 32-2 in the charge readout path 22-2 in FIG. 2. Accordingly, by transferring the long storage to the charge storage gate 32-1, the pixel 11A can achieve a high SNR from a low illuminance. Furthermore, by transferring the short storage to the capacitor 71, the pixel 11A can prevent electric charges from overflowing even in the case of a high-luminance object, such as the sun. That is, in the pixel 11A, the capacitor 71 and the charge storage gate 32-2 are designed so that the possible charge storage capacities differ from each other, the long storage is transferred to the charge storage gate 32-2 having the smaller charge storage capacity, and the short storage is transferred to the capacitor 71 having the larger charge storage capacity.

For example, the storage capacity of the capacitor 71 is set at a value (60+20 dB) 10 or more times greater than the storage capacity (60 dB) of the charge storage gate 32-1, and the storage time difference between the two is set at 1:1000 (+60 dB). In this manner, an HDR image with (60+60)=120 dB can be generated while 20 dB is maintained during the HDR combining.

Thus, an imaging device 1 including such a pixel 11A can capture an HDR image having a sufficient dynamic range, even though the pixel 11A has a structure including the two charge readout paths 22-1A and 22-2A (2-tap structure). Furthermore, the pixel 11A has a simpler configuration than the pixel 11, and the imaging device 1 including the pixel 11A has a structure advantageous for miniaturization, for example.

It should be noted that, other than the structure shown in the drawings, the pixel 11A can employ a charge storage unit having any appropriate structure, such as a structure of a floating diffusion type or a buried-channel type with a virtual gate. In such a case, the capacities of these charge storage units can be set at different values in accordance with the dynamic range ratio and the SNR.

Referring now to FIG. 7, a method of driving the imaging device 1 including the pixel 11A is described.

In the example shown in FIG. 7, electric charges are transferred from the PD 21 in the following order: the long storage to the charge storage gate 32-1, and the short storage to the capacitor 71. Then, the charge exposure time per charge transfer operation to be performed multiple times for the charge storage gate 32-1 and the capacitor 71 is set at a sufficiently shorter time than the exposure time of one frame, and long storage transfer and short storage transfer are repeatedly performed in one frame.

First, as shown in the drawing, exposure for the long storage is started at the time when the discharge pulse ABG switches to "on" at time t1, and the electric charges stored in the PD 21 are discharged via the anti-blooming gate 23. Then, at time t2, the transfer pulse FSG1 switches to "on", and the long storage is transferred from the PD 21 to the charge storage gate 32-1.

After that, at time t3, the discharge pulse ABG switches to "on", and exposure for the short storage is started. At time t4, the transfer pulse FSG2 switches to "on", and the short storage is transferred from the PD 21 to the capacitor 71.

Thereafter, such transfer of the long storage and the short storage between time t1 and time t4 is repeatedly performed in a similar manner during one frame. For example, where the ratio between the exposure times for the short storage and the long storage is set at 0.5 μs: 50 μs=1:100, the imaging device 1 can obtain an HDR image with +40 dB.

It should be noted that, like FIG. 4, FIG. 7 shows an example where imaging is performed with a sensitivity of ½ of the maximum sensitivity of the pixel 11A. Further, the transfer pulses FSG1 to FSG3 and the discharge pulse ABG are set so as to be synchronized with one line in the rolling shutter reading. In this manner, the synchronous circuit design can be simplified.

By the above driving method, the imaging device 1 can achieve both a high SNR at a time of low illuminance and a resistance to high luminance. Furthermore, by virtue of the burst distribution driving in which exposure of a sufficiently shorter time than one frame is repeatedly performed, it is possible to image a pulsed light emission source, such as an LED light source, even on the short storage side. Power consumption can also be reduced.

Figure 8:
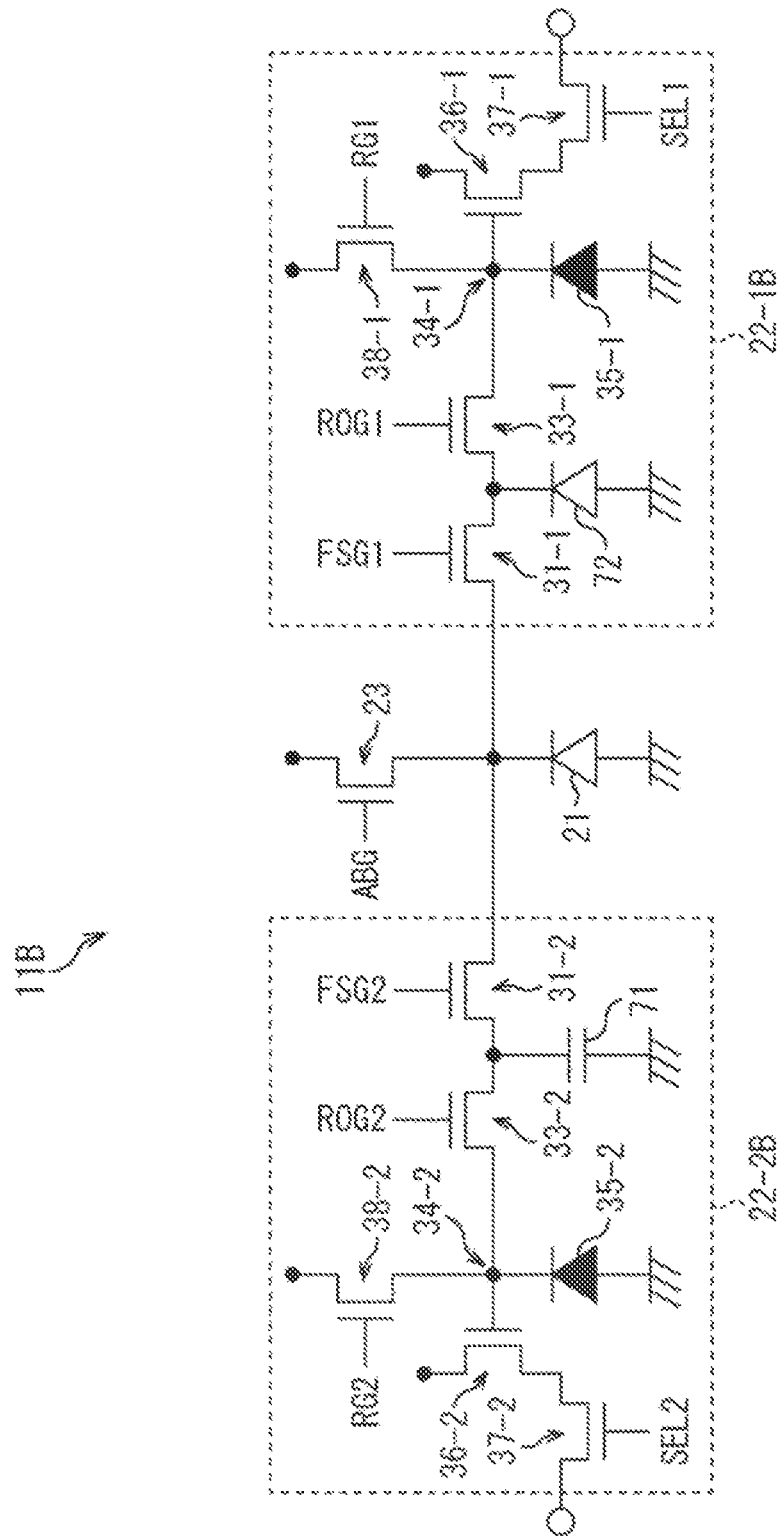
FIG. 8 is a circuit diagram showing a third configuration example of a pixel.
Figure 9:
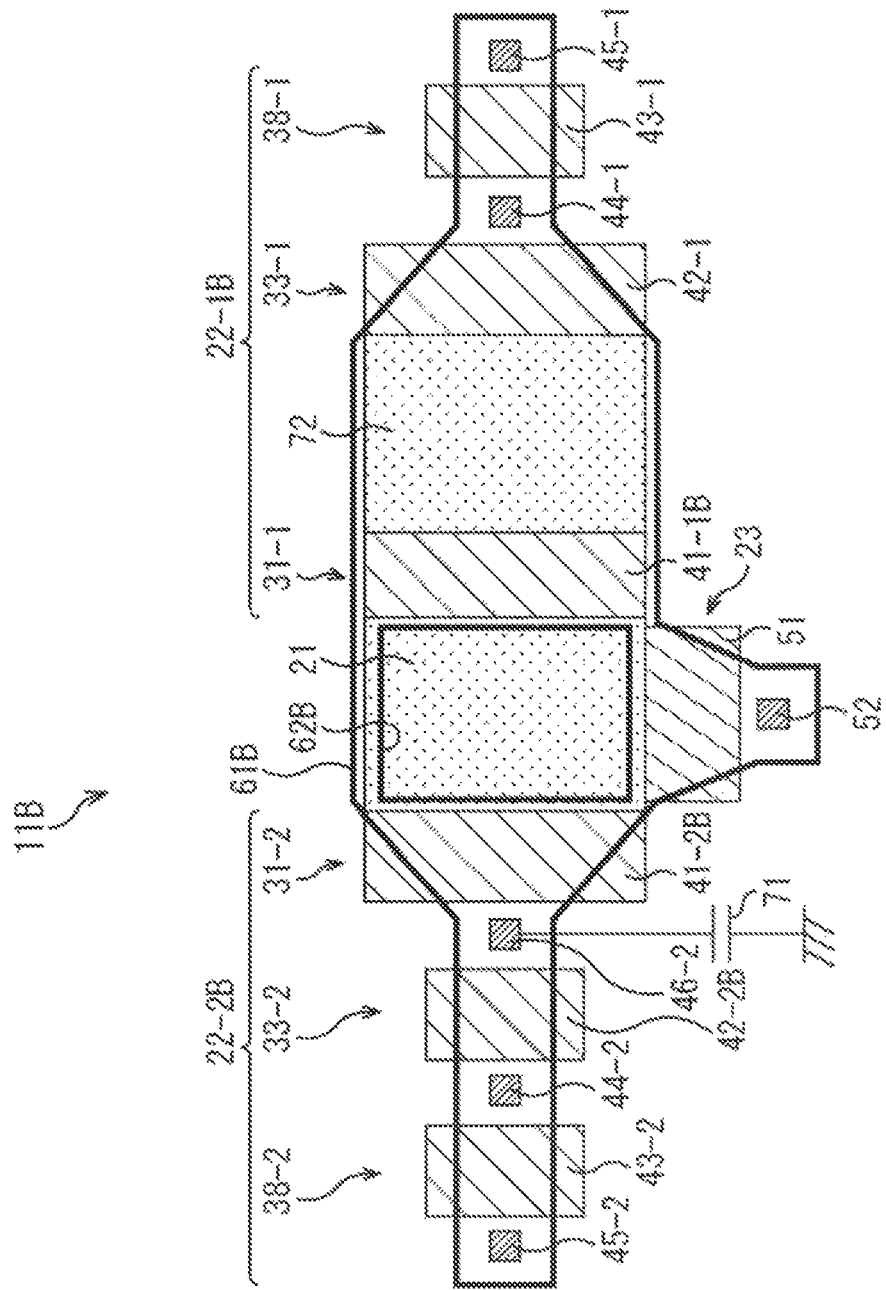
FIG. 9 is a diagram showing a planar configuration example of the pixel of the third configuration example.

Referring now to FIGS. 8 and 9, a third configuration example of a pixel 11 is described.

FIG. 8 shows a circuit diagram of a pixel 11B as the third configuration example. FIG. 9 shows a planar configuration example of the pixel 11B.

As shown in FIGS. 8 and 9, the pixel 11B includes a PD 21, a charge readout path 22-1B, a charge readout path 22-2B, and an anti-blooming gate 23. It should be noted that the PD 21 and the anti-blooming gate 23 have configurations similar to those of the pixel 11 shown in FIG. 2, and therefore, detailed explanation thereof is not made herein. Meanwhile, the charge readout path 22-2B has a configuration similar to that of the charge readout path 22-2A shown in FIG. 5.

That is, in the pixel 11B, the structure of the charge readout path 22-1B differs from that of the charge readout path 22-1A shown in FIG. 5.

The charge readout path 22-1B includes a transfer gate 31-1, a light-shielded hole accumulation diode (HAD) 72, a readout gate 33-1, an FD unit 34-1, a storage capacitor 35-1, an amplification transistor 36-1, a select transistor 37-1, and a reset transistor 38-1. As described above, the charge readout path 22-1B differs from the charge readout path 22-1A in FIG. 5 in that the charge storage gate 32-1 is replaced with the light-shielded HAD 72 with low noise.

In the pixel 11B having such a configuration, an electric charge in the PD 21 is transferred to the light-shielded HAD 72 via the transfer gate 31-1, and is stored therein. That is, the pixel 11B is designed to employ a photodiode structure of a light-shielded HAD type, instead of a buried-channel-type charge storage unit, as the charge storage unit in the charge readout path 22-1B. It should be noted that the difference between the structure of the light-shielded HAD 72 and the structure of the PD 21 is only that the light-shielded HAD 72 is shielded by a light shielding film 61B while the PD 21 is not shielded from light. Accordingly, the light-shielded HAD 72 used as a charge storage unit can also achieve a SNR similar to that to be achieved by the PD 21.

Thus, the pixel 11B can achieve a high SNR from a low illuminance, by transferring the long storage to the light-shielded HAD 72. Furthermore, by transferring the short storage to the capacitor 71, the pixel 11B, like the pixel 11A, can prevent electric charges from overflowing even in the case of a high-luminance object, such as the sun.

Also, an imaging device 1 including the pixel 11B can be driven by a driving method similar to the method of driving the imaging device 1 having the pixel 11A as described above with reference to FIG. 7. Thus, the imaging device 1 can achieve both a high SNR at a time of low illuminance and a resistance to high luminance.

Accordingly, like the imaging device 1 including the above described pixel 11A, the imaging device 1 including such a pixel 11B can capture an HDR image having a sufficient dynamic range, even though the pixel 11B has a structure including the two charge readout paths 22-1B and 22-2B (2-tap structure). Furthermore, the pixel 11B has a simpler configuration than the pixel 11, and the imaging device 1 including the pixel 11B has a structure advantageous for miniaturization, for example.

Figure 10:
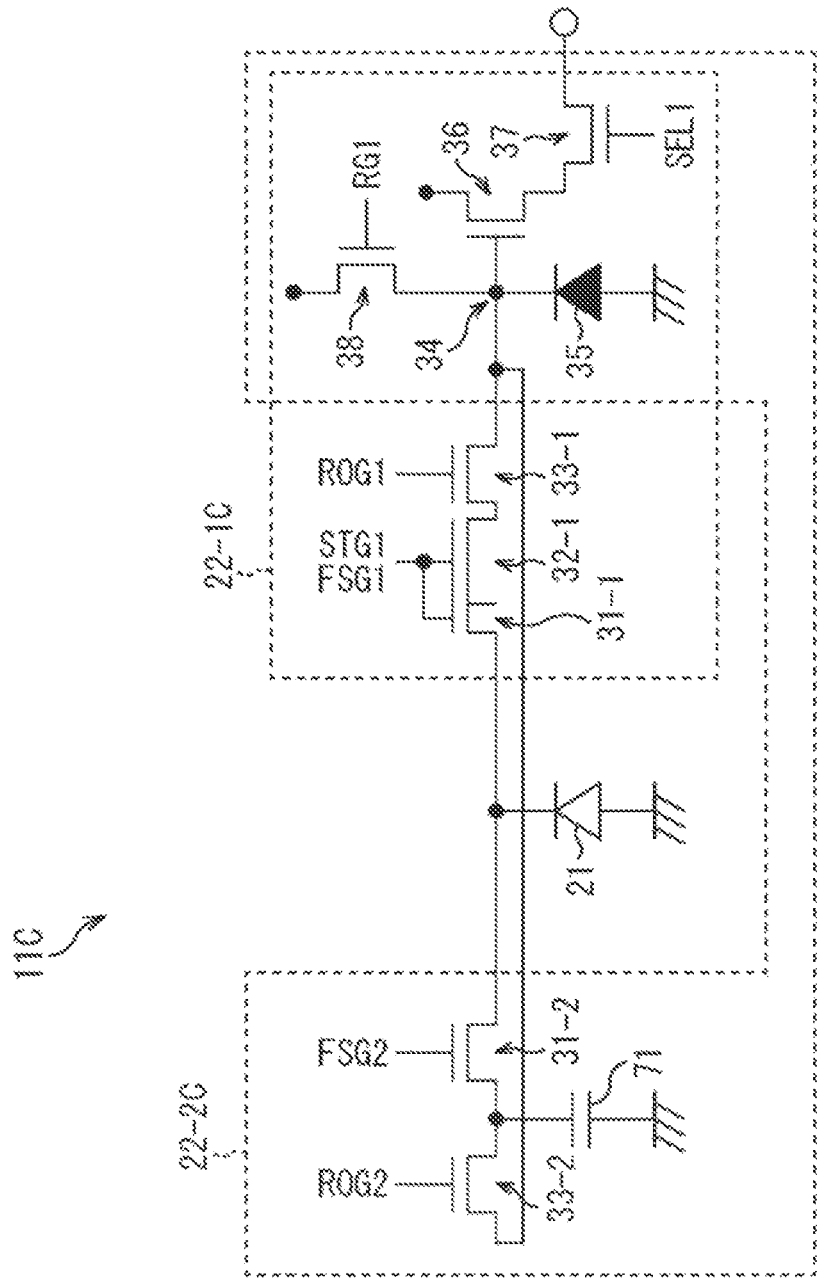
FIG. 10 is a circuit diagram showing a fourth configuration example of a pixel.
Figure 11:
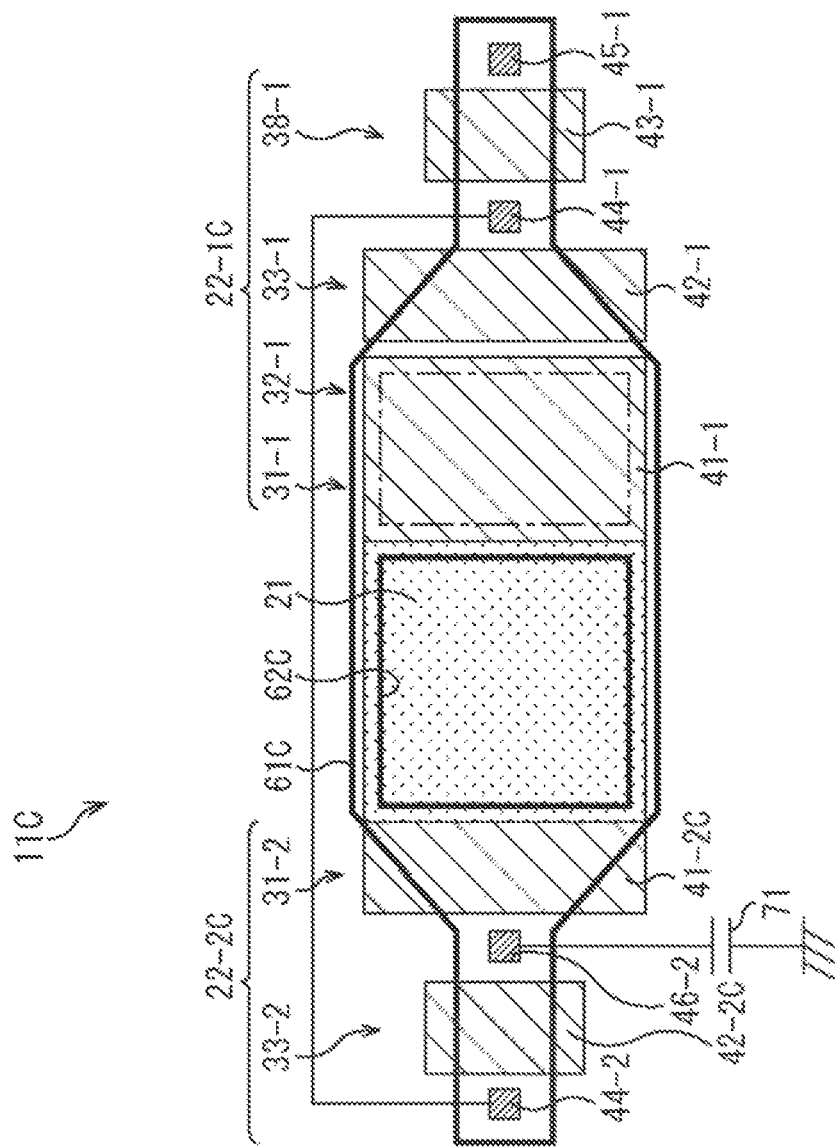
FIG. 11 is a diagram showing a planar configuration example of the pixel of the fourth configuration example.
Figure 12:
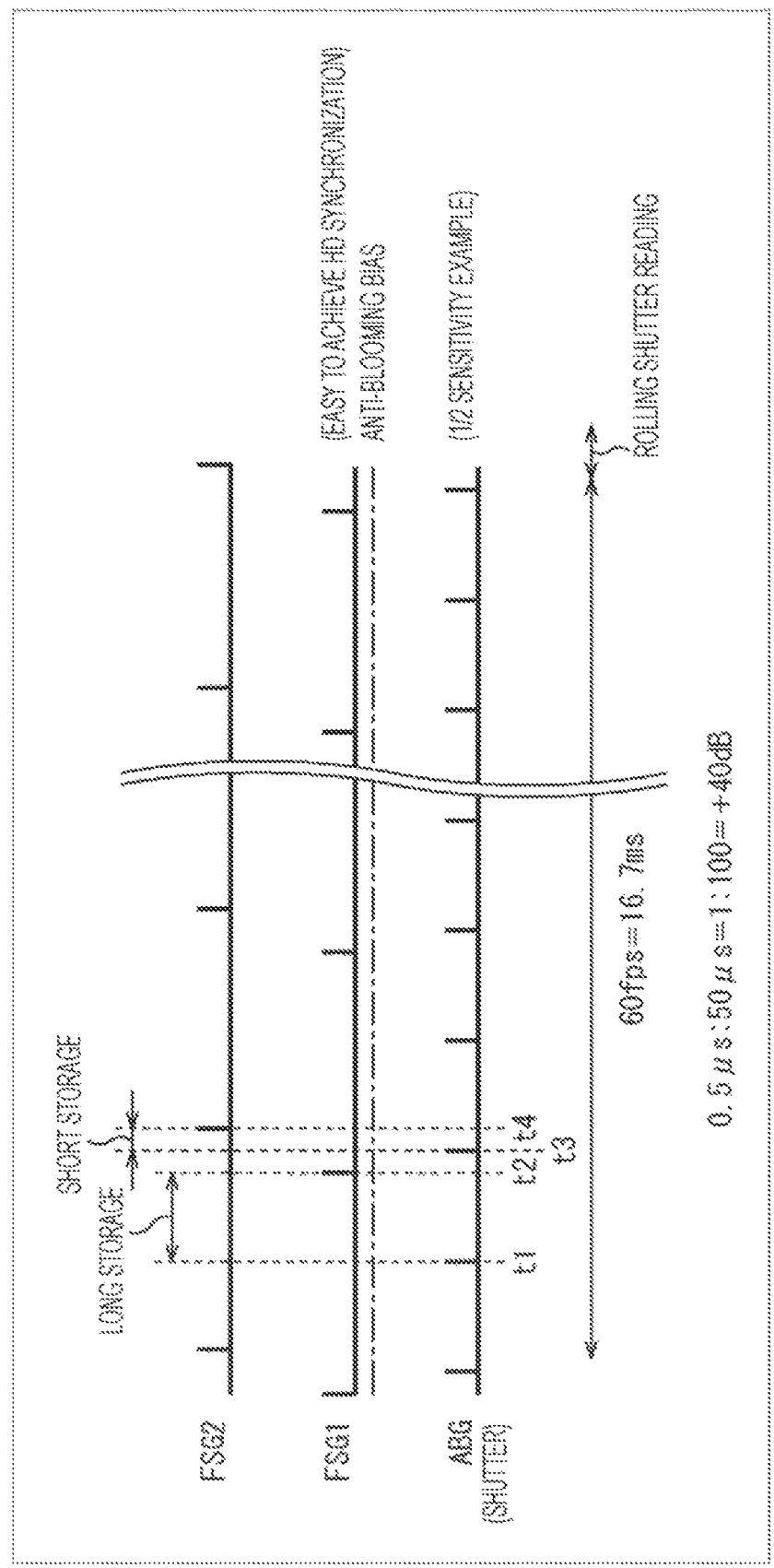
FIG. 12 is a diagram for explaining a method of driving an imaging device including pixels of the fourth configuration example.

Referring now to FIGS. 10 to 12, a fourth configuration example of a pixel 11 and a driving method are described.

FIG. 10 shows a circuit diagram of a pixel 11C as the fourth configuration example. FIG. 11 shows a planar configuration example of the pixel 11C.

As shown in FIGS. 10 and 11, the pixel 11C includes a PD 21, a charge readout path 22-1C, and a charge readout path 22-2C.

The pixel 11C differs from the pixel 11A shown in FIG. 5, for example, in that the anti-blooming gate 23 is not provided, and the charge readout path 22-1C and the charge readout path 22-2C share some components.

For example, the ratio (HDR ratio) between the charge storage gate 32-1 and the capacitor 71 is set at such a ratio that electric charges do not overflow even in the case of a high-luminance object, such as the sun. In this manner, the anti-blooming gate 23 can be made unnecessary. In view of this, the pixel 11C does not include the anti-blooming gate 23.

It should be noted that the bias of the transfer gate 31-1 is set so that the electric charges first overflow toward the side of the charge readout path 22-1C in a case where electric charges overflow from the PD 21. That is, the potential is set so that electric charges overflowing from the PD 21 are discharged to the charge storage gate 32-1 having a smaller charge storage capacity than the capacitor 71. In a case where electric charges overflow from the PD 21 in this manner, it is possible to form an image using only the electric charges read from the side of the charge readout path 22-2C.

Further, the pixel 11C is designed so that an FD unit 34, a storage capacitor 35, an amplification transistor 36, a select transistor 37, and a reset transistor 38 are shared between the charge readout path 22-1C and the charge readout path 22-2C. In such a configuration in which the charge readout path 22-1C and the charge readout path 22-2C share the FD unit 34 and the components in the later stages as described above, control is performed so that the respective electric charges are read as pixel signals at different times. Further, the configuration in which the charge readout path 22-1C and the charge readout path 22-2C share the FD unit 34 and the components in the later stages can be formed simply by adding a readout gate 33-2 to a conventional global shutter pixel, for example.

Further, in the pixel 11C, the capacitor 71 may be disposed in a region indicated by a dot-and-dash line in FIG. 11. That is, in the pixel 11C, the capacitor 71 is positioned so as to overlap the transfer gate 31-1 and the gate electrode 41-1 of the charge storage gate 32-1, and thus, the planar layout is effectively used. In this manner, the capacity of the capacitor 71 can be maintained.

The pixel 11C having such a configuration is simpler than the pixel 11 and the pixels 11A and 11B, and accordingly, can be made smaller in size. An imaging device 1 including the pixel 11C is remarkably advantageous for miniaturization, for example.

It should be noted that, in a use case where shutter control is necessary, it is preferable to provide the anti-blooming gate 23 (see FIG. 2) in the pixel 11C, and an appropriate configuration can be employed in accordance with the purpose of use.

It should be noted that, other than the structure shown in the drawings, the pixel 11C can also employ a charge storage unit having any appropriate structure, such as a structure of a floating diffusion type or a buried-channel type with a virtual gate. In such a case, the capacities of these charge storage units can be set at different values in accordance with the dynamic range ratio and the SNR.

Referring now to FIG. 12, a method of driving the imaging device 1 including the pixel 11C is described. It should be noted that FIG. 12 illustrates a driving method to be implemented in a case where the pixel 11C includes the anti-blooming gate 23, and shutter control is performed.

In the example shown in FIG. 12, electric charges are transferred from the PD 21 in the following order: the long storage to the charge storage gate 32-1, and the short storage to the capacitor 71. Then, the charge exposure time per charge transfer operation to be performed multiple times for the charge storage gate 32-1 and the capacitor 71 is set at a sufficiently shorter time than the exposure time of one frame, and long storage transfer and short storage transfer are repeatedly performed in one frame.

First, as shown in the drawing, exposure for the long storage is started at the time when the discharge pulse ABG switches to "on" at time t1, and the electric charges stored in the PD 21 are discharged via the anti-blooming gate 23. Then, at time t2, the transfer pulse FSG1 switches to "on", and the long storage is transferred from the PD 21 to the charge storage gate 32-1.

After that, at time t3, the discharge pulse ABG switches to "on", and exposure for the short storage is started. At time t4, the transfer pulse FSG2 switches to "on", and the short storage is transferred from the PD 21 to the capacitor 71.

Thereafter, such transfer of the long storage and the short storage between time t1 and time t4 is repeatedly performed in a similar manner during one frame. For example, where the ratio between the exposure times for the short storage and the long storage is set at 0.5 µs: 50 µs=1:100, the imaging device 1 can obtain an HDR image with +40 dB.

It should be noted that, like FIG. 4, FIG. 12 shows an example where imaging is performed with a sensitivity of ½ of the maximum sensitivity of the pixel 11A. Further, the transfer pulses FSG1 and FSG2, and the discharge pulse ABG are set so as to be synchronized with one line in the rolling shutter reading. In this manner, the synchronous circuit design can be simplified. It should be noted that, in a structure without the anti-blooming gate 23 as shown in FIG. 10 and FIG. 11, the discharge pulse ABG shown in FIG. 12 is not used for driving, and a maximum sensitivity state is always maintained.

By the above driving method, the imaging device 1 can achieve both a high SNR at a time of low illuminance and a resistance to high luminance. Furthermore, by virtue of the burst distribution driving in which exposure of a sufficiently shorter time than one frame is repeatedly performed, it is possible to image a pulsed light emission source, such as an LED light source, even on the short storage side.

Figure 13:
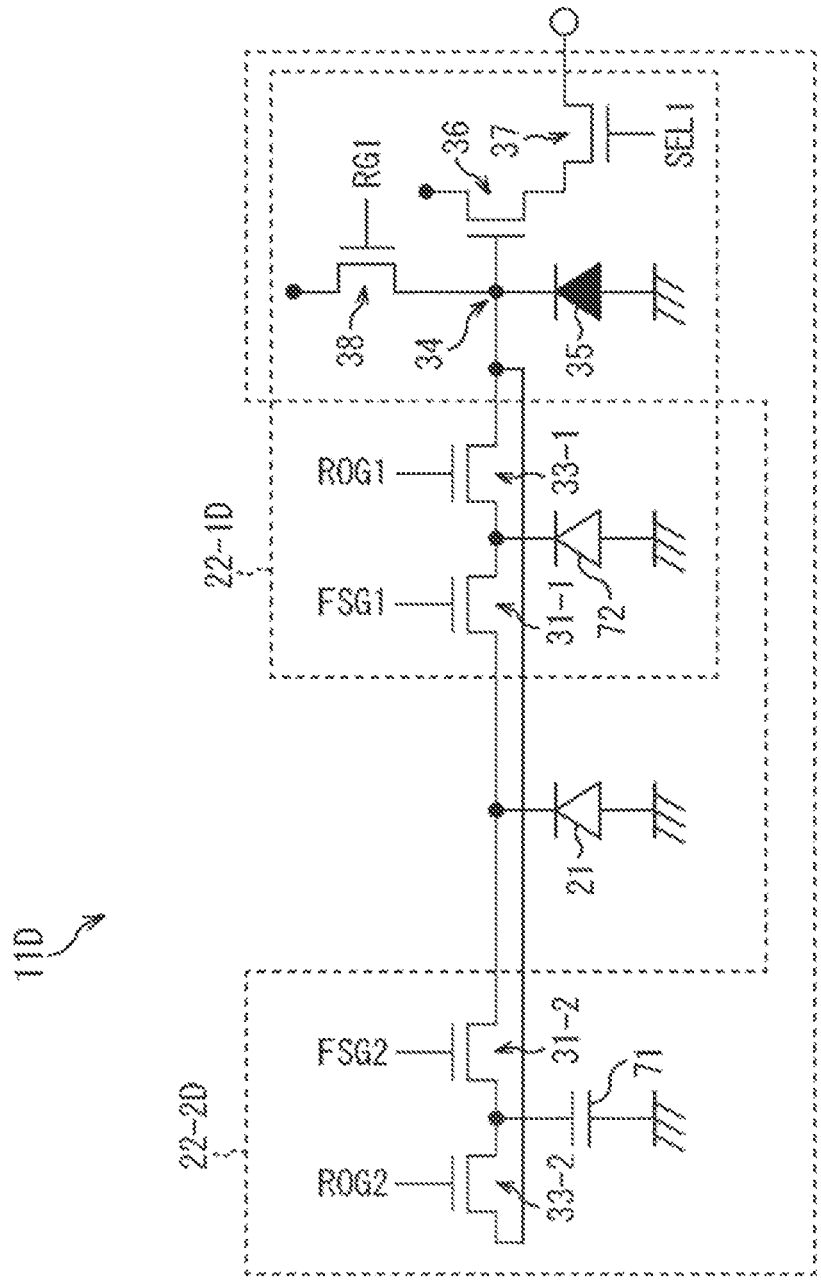
FIG. 13 is a circuit diagram showing a fifth configuration example of a pixel.
Figure 14:
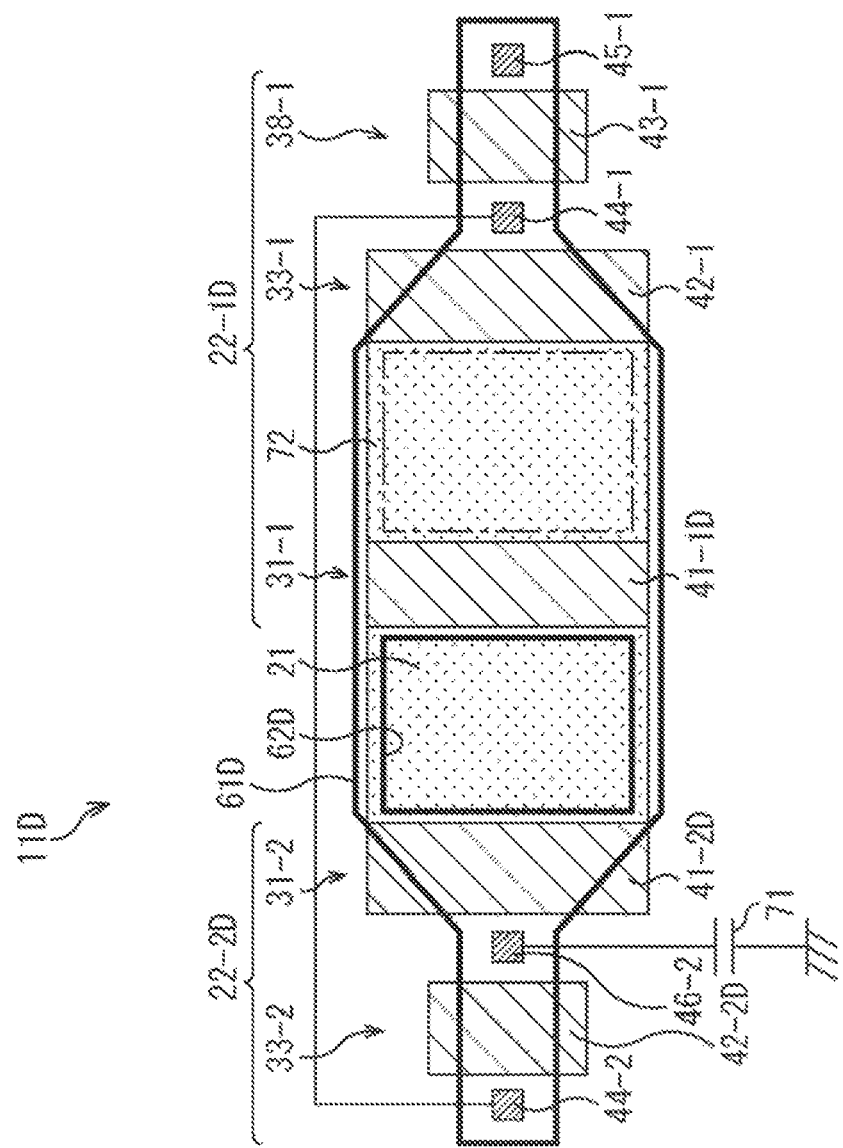
FIG. 14 is a diagram showing a planar configuration example of the pixel of the fifth configuration example.

Referring now to FIGS. 13 and 14, a fifth configuration example of a pixel 11 is described.

FIG. 13 shows a circuit diagram of a pixel 11D as the fifth configuration example. FIG. 14 shows a planar configuration example of the pixel 11D.

As shown in FIGS. 13 and 14, the pixel 11D includes a PD 21, a charge readout path 22-1D, and a charge readout path 22-2D. Meanwhile, the charge readout path 22-2D has a configuration similar to that of the charge readout path 22-2C shown in FIG. 10.

That is, in the pixel 11D, the structure of the charge readout path 22-1D differs from that of the charge readout path 22-1C shown in FIG. 10.

The charge readout path 22-1D includes a transfer gate 31-1, a light-shielded HAD 72, a readout gate 33-1, an FD unit 34-1, a storage capacitor 35-1, an amplification transistor 36-1, a select transistor 37-1, and a reset transistor 38-1. As described above, the charge readout path 22-1D differs from the charge readout path 22-1C in FIG. 10 in that the charge storage gate 32-1 is replaced with the light-shielded HAD 72.

In the pixel 11D having such a configuration, an electric charge in the PD 21 is transferred to the light-shielded HAD 72 via the transfer gate 31-1, and is stored therein. That is, the pixel 11D is designed to employ a photodiode structure of a light-shielded HAD type, instead of a buried-channel-type charge storage unit, as the charge storage unit in the charge readout path 22-1D.

Thus, the pixel 11D can achieve a high SNR from a low illuminance, by transferring the long storage to the light-shielded HAD 72. Furthermore, by transferring the short storage to the capacitor 71, the pixel 11D, like the pixel 11C, can prevent electric charges from overflowing even in the case of a high-luminance object, such as the sun.

Also, an imaging device 1 including the pixel 11D can be driven by a driving method similar to the method of driving the imaging device 1 having the pixel 11C as described above with reference to FIG. 12. Thus, the imaging device 1 can achieve both a high SNR at a time of low illuminance and a resistance to high luminance.

Accordingly, like the imaging device 1 including the above described pixel 11C, the imaging device 1 including such a pixel 11D can capture an HDR image having a sufficient dynamic range, even though the pixel 11D has a structure including the two charge readout paths 22-1D and 22-2D (2-tap structure). Furthermore, like the imaging device 1 including the pixel 11C, the imaging device 1 including the pixel 11D is remarkably advantageous for miniaturization, for example.

Also, in the pixel 11D, the capacitor 71 may be disposed in a region indicated by a dot-and-dash line in FIG. 14. In this manner, the pixel 11D can maintain the capacity of the capacitor 71, like the pixel 11C shown in FIG. 11. It should be noted that, in the pixels 11C and 11D, adjacent pixels may share the FD unit 34 and the components in the later stages.

Figure 15:
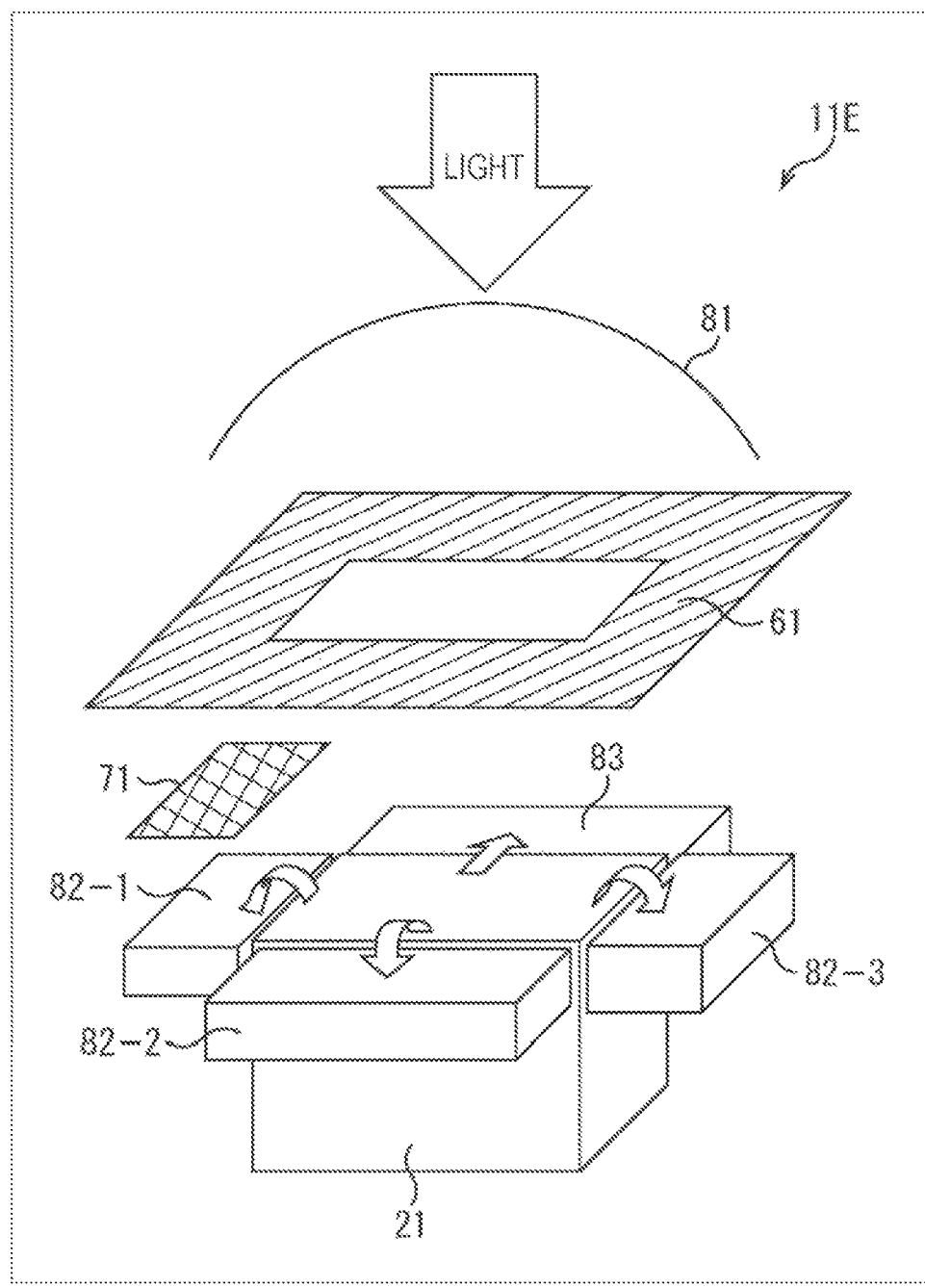
FIG. 15 is a schematic perspective view of the configuration of a pixel provided in a front-illuminated imaging device.
Figure 16:
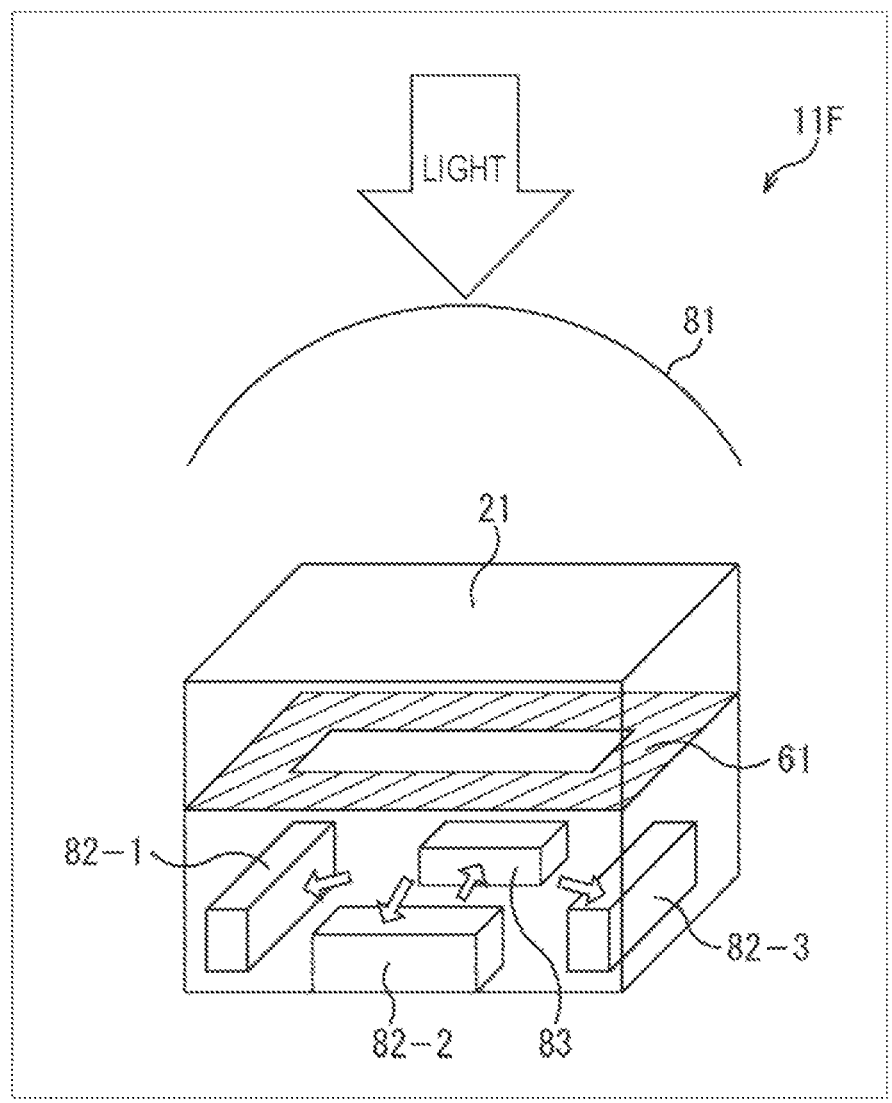
FIG. 16 is a schematic perspective view of the configuration of a pixel provided in a back-illuminated imaging device.
Figure 17:
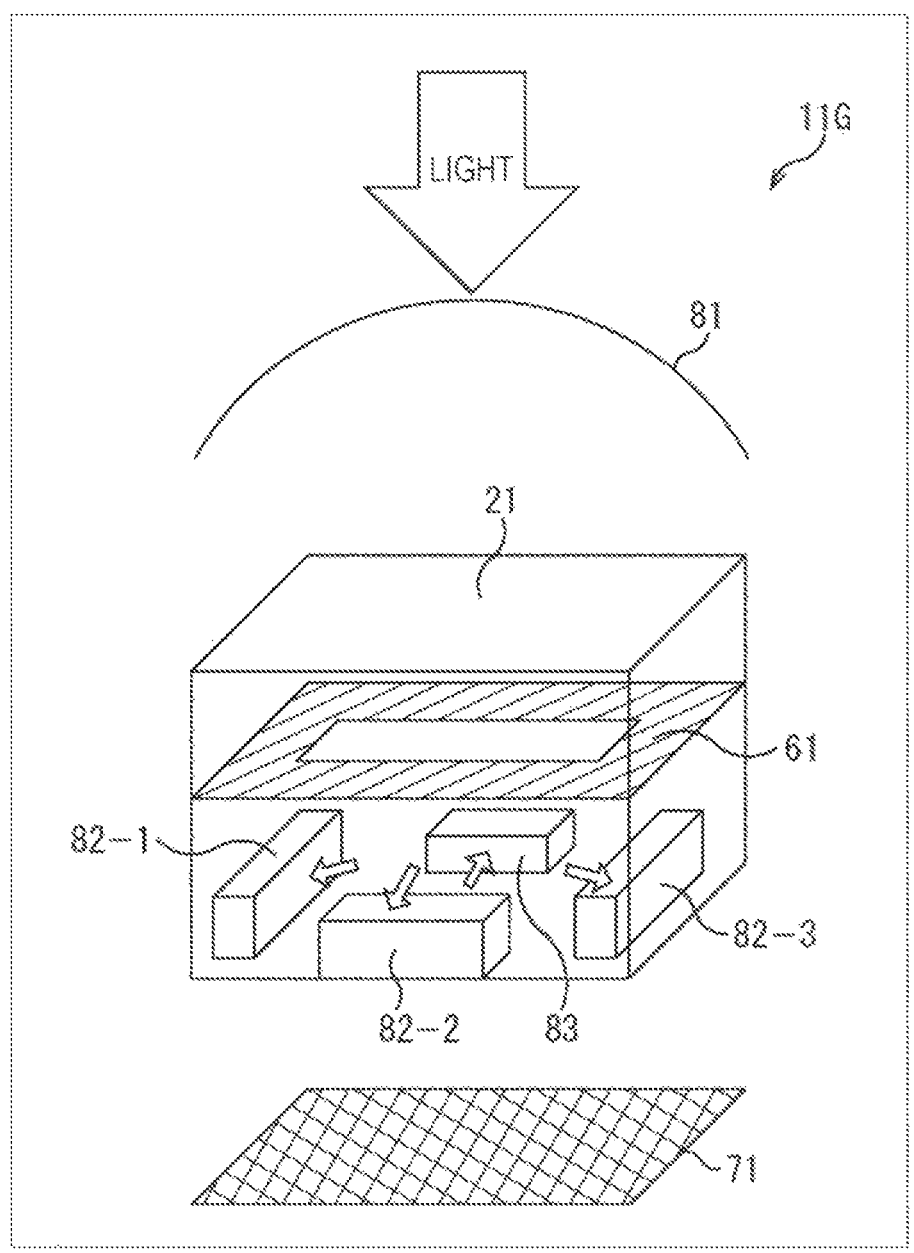
FIG. 17 is a schematic perspective view of the configuration of a pixel provided in a back-illuminated imaging device.

Referring now to FIGS. 15 to 17, three-dimensional configuration examples of pixels 11 are described.

An imaging device 1 is of one of the two types: a front-illuminated type in which a semiconductor substrate having a PD 21 formed therein is irradiated with light from the side of the front surface on which a wiring layer and the like are stacked; and a back-illuminated type in which the front surface is irradiated with light from the side of the back surface located on the opposite side from the front surface, for example. FIG. 15 shows a configuration example of a pixel 11E of a front-illuminated imaging device 1. FIGS. 16 and 17 show configuration examples of a pixel 11F and a pixel 11G of a back-illuminated imaging device 1, respectively. Also, the pixels 11E to 11G shown in FIGS. 15 to 17 each have a structure (3-tap structure) in which charge storage units are arranged in three directions with respect to the PD 21, as in the pixel 11 shown in FIG. 2.

FIG. 15 shows a schematic perspective view of the configuration of a pixel 11E provided in a front-illuminated imaging device 1.

An on-chip lens 81 is provided on each pixel 11E. Light that enters via the on-chip lens 81 passes through an opening in a light shielding film 61 stacked on the wiring layer side of a semiconductor substrate having a PD 21 provided therein, and irradiates the PD 21.

As shown in the drawing, charge storage units 82-1 to 82-3 are provided in three directions with respect to the PD 21, and a reset drain 83 is provided in the remaining one direction. The charge storage units 82-1 to 82-3 are equivalent to the charge storage gates 32-1 to 32-3 (see FIG. 2), for example, and electric charges are transferred from the PD 21 to the charge storage units 82-1 to 82-3 by the driving method described above with reference to FIG. 4. The reset drain 83 is used to discharge the electric charges in the PD 21 via the anti-blooming gate 23 (see FIG. 2).

It should be noted that, in a case where the pixel 11E includes a capacitor 71 (see FIG. 5) in place of the charge storage unit 82-1 in the configuration example in FIG. 15, the capacitor 71 is disposed in a wiring layer provided between the semiconductor substrate having the PD 21 formed therein and the light shielding film 61.

As described above, in the pixel 11E provided in the front-illuminated imaging device 1, the PD 21 and the charge storage units 82-1 to 82-3 are arranged in the same plane.

FIG. 16 shows a schematic perspective view of the configuration of a pixel 11F provided in a back-illuminated imaging device 1.

An on-chip lens 81 is provided on each pixel 11F, and light that enters via the on-chip lens 81 is applied to a PD 21. A light shielding film 61 is stacked on the front surface side of the PD 21 (the side of the surface facing downward in FIG. 16), and the light shielding film 61 shields charge storage units 82-1 to 82-3 and a reset drain 83 from light.

As shown in the drawing, the charge storage units 82-1 to 82-3 and the reset drain 83 are disposed on the front surface side of the semiconductor substrate having the PD 21 provided on its back side, so as to overlap the PD 21 when seen in a plan view. As described above, the PD 21 and the charge storage units 82-1 to 82-3 are not arranged in the same plane in the pixel 11F provided in the back-illuminated imaging device 1. Accordingly, the charge storage units 82-1 to 82-3 can be designed to have larger areas than those in the pixel 11E shown in FIG. 15.

In this manner, the size of the entire pixel 11F can be reduced, for example. That is, most of the back surface side can be used for the charge storage units 82-1 to 82-3, and the pixel 11F can be made smaller accordingly. Furthermore, as the aperture ratio of the PD 21 can be increased without being affected by the charge storage units 82-1 to 82-3, photosensitivity can be increased.

FIG. 17 shows a schematic perspective view of the configuration of a pixel 11G provided in a back-illuminated imaging device 1.

As shown in FIG. 17, the pixel 11G is formed by adding a capacitor 71 to the structure of the pixel 11F shown in FIG. 16. For example, in the pixel 11E included in the back-illuminated imaging device 1 in FIG. 15, the capacitor 71 can be disposed only below the light shielding film 61 (that is, the capacitor 71 cannot be placed in the opening), which restricts the capacity of the capacitor 71 to a small value.

In the pixel 11G, on the other hand, there is no such restriction, and the entire region of the pixel 11G can be used for the capacitor 71. Accordingly, the area and the capacity of the capacitor 71 can be made larger in the pixel 11G, without affecting the photosensitivity of the PD 21.

Figure 18:
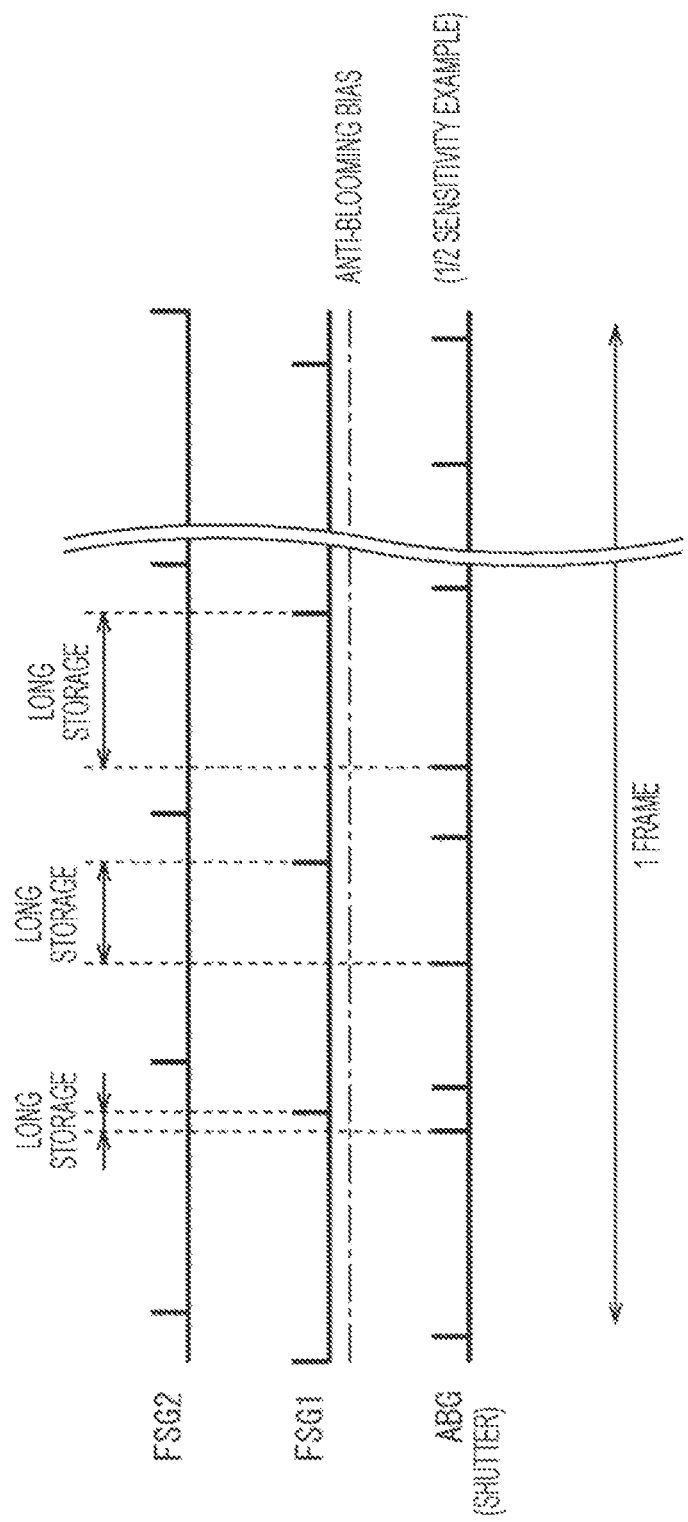
FIG. 18 is a diagram for explaining a first modification of the driving method.
Figure 19:
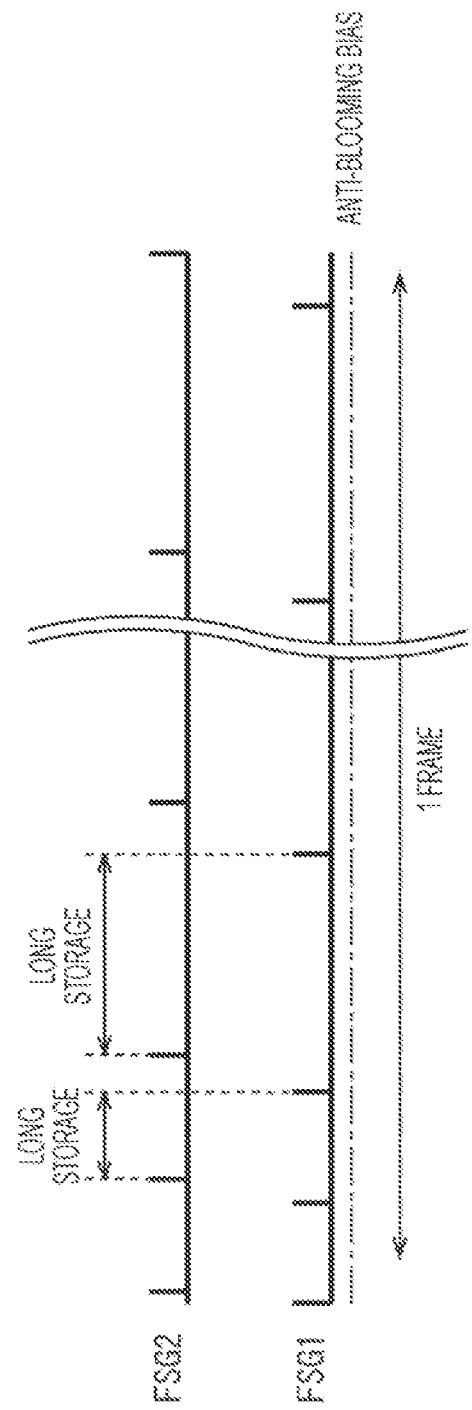
FIG. 19 is a diagram for explaining a second modification of the driving method.

Referring now to FIGS. 18 and 19, modifications of the driving method are described.

According to the driving method described above, the exposure times for the short storage, the medium storage, and the long storage are substantially uniform and are repeated over the light reception period of one frame. However, it is possible to drive an imaging device 1 in such a manner that the exposure times for the long storage, the medium storage, and the short storage become longer in a later stage in the light reception period of one frame.

FIG. 18 shows a first modification of the driving method. In FIG. 18, an example of the exposure time for the long storage is shown. In this example, the exposure time becomes longer logarithmically as the light reception period of one frame elapses.

FIG. 19 shows a driving method that does not involve the anti-blooming gate 23, as a second modification of the driving method. In FIG. 19, an example of the exposure time for the long storage is shown. In this example, the exposure time becomes longer logarithmically as the light reception period of one frame elapses.

As described above, even if the cycle of repeating the exposure time is not substantially the same in an imaging device 1, HDR combining can be performed as long as the exposure ratio after accumulation is constant among the short storage, the medium storage, and the long storage. Also, even if the exposure ratio after accumulation varies, HDR combining is performed with a corrected exposure ratio, so that the influence on the resultant HDR image can be reduced. For example, a more preferable HDR image can be obtained, if some other effect that is more beneficial than its influence has been achieved.

For example, as shown in FIGS. 18 and 19, an imaging device 1 can employ a driving method by which the exposure ratio is constant while the interval extends logarithmically (this method will be hereinafter referred to as the nonlinear burst driving, where appropriate).

If a high-speed electronic shutter is used in a conventional imaging device that performs readout control only once for a frame, blurring of each moving object is eliminated, and the image appears sill like a still image. However, in a case where the frame rate is 30 fps, the resultant image is a non-smooth image that looks like cutoff animation, with images of approximately 1/30 s missing, unless the frame rate is increased. Particularly, in a case where the reproduction frame frequency is low, the resultant image becomes unpleasant to the eye. Moreover, to perform a process equivalent to a high-speed process at quadruple speed (=240 fps) so as to eliminate the feeling of cutoff animation in a today's television receiver, the speed of the imaging device needs to be four times higher, which requires an enormous increase in power consumption.

To counter this, the nonlinear burst driving in which storage times are allocated so that logarithmic distribution in the temporal axis is achieved should be effective for a conventional electronic shutter that cannot achieve both smoothness and sharpness by performing exposure only at the last one moment of one frame. With this, exposure control similar to the logarithmic response characteristics of the human eye is performed, and thus, an electronic shutter that can achieve both smoothness and sharpness without blurring of a moving object can be obtained. That is, through the nonlinear burst distribution driving, the same logarithmic sensitivity characteristics as the response characteristics of the human eye can be achieved, and a moving image that can be reproduced smoothly relative to the moving object (smooth and sharp reproduction) can be captured.

It should be noted that an imaging device 1 including pixels 11 of any of the above described examples can be used in various kinds of electronic apparatuses, such as imaging systems for digital still cameras and digital video cameras, portable telephone devices having imaging functions, and other apparatuses having imaging functions.

Figure 20:
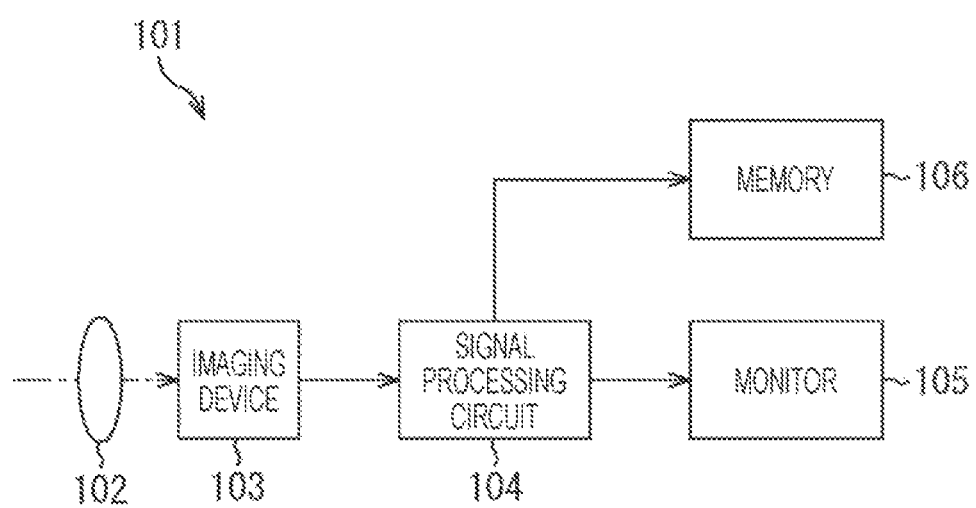
FIG. 20 is a block diagram showing an example configuration of an embodiment of an imaging apparatus to which the present technology is applied.

FIG. 20 is a block diagram showing an example configuration of an imaging apparatus mounted in an electronic apparatus.

As shown in FIG. 20, an imaging apparatus 101 includes an optical system 102, an imaging device 103, a signal processing circuit 104, a monitor 105, and a memory 106, and can take still images and moving images.

The optical system 102 includes one or more lenses to guide image light (incident light) from the object to the imaging device 103, and form an image on the light receiving surface (the sensor portion) of the imaging device 103.

An imaging device 1 including pixels 11 of any of the above described embodiments may be used as the imaging device 103. In the imaging device 103, electrons are accumulated for a certain period of time in accordance with an image to be formed on the light receiving surface via the optical system 102. Then, a signal in accordance with the electrons accumulated in the imaging device 103 is then supplied to the signal processing circuit 104.

The signal processing circuit 104 performs various kinds of signal processing on pixel signals that are output from the imaging device 103. The image (image data) obtained through the signal processing performed by the signal processing circuit 104 is supplied to and displayed on the monitor 105, or is supplied to and stored (recorded) into the memory 106.

In the imaging apparatus 101 having the above described configuration, an imaging device 1 including pixels 11 of any of the above embodiments is used, so that HDR images with a higher image quality can be taken.

It should be noted that the present technology may also be embodied in the configurations described below.

(1)
An imaging device including:
a pixel region in which pixels are arranged, the pixels each including a photoelectric conversion unit that converts incident light into electric charges through electric conversion and stores the electric charges, and two or more charge storage units that store the electric charges transferred from the photoelectric conversion unit; and
a drive unit that drives each pixel to cause the photoelectric conversion unit to repeatedly transfer electric charges with different exposure times to the two or more charge storage units during the light reception period of one frame.

(2)
The imaging device of (1), in which the two or more charge storage units have different possible charge storage capacities.

(3)
The imaging device of (1) or (2), in which an electric charge with a long exposure time is transferred to the charge storage unit having the smaller charge storage capacity of the two or more charge storage units, and an electric charge with a short exposure time is transferred to the charge storage unit having the larger charge storage capacity.

(4)
The imaging device of any of (1) to (3), further including an anti-blooming gate that discharges electric charges overflowing from the photoelectric conversion unit during the exposure period for the pixel.

(5)
The imaging device of (3), in which a potential is set so that electric charges overflowing from the photoelectric conversion unit during the exposure period for the pixel is discharged to the charge storage unit having the smaller charge storage capacity.

(6)
The imaging device of any of (3) to (5), in which a storage unit having a capacitor structure that extends through a diffusion junction is used as the charge storage unit having the larger charge storage capacity.

(7)
The imaging device of any of (3) to (6), in which a storage unit having a light-shielded photodiode structure is used as the charge storage unit having the smaller charge storage capacity.

(8)
The imaging device of any of (1) to (7), further including a charge-voltage conversion unit that converts an electric charge generated in the photoelectric conversion unit into a voltage,
in which
electric charges are transferred from the two or more charge storage units to the charge-voltage conversion unit that is shared, and
the two or more charge storage units share the charge-voltage conversion unit and components in later stages.

(9)
The imaging device of any of (1) to (8), in which the drive unit performs driving so that the exposure time for the electric charge to be transferred to each of the two or more charge storage units is substantially the same in each of the charge storage units during the light reception period of one frame.

(10)
The imaging device of any of (1) to (9), in which the drive unit performs driving so that the exposure time for the electric charge to be transferred to each of the two or more charge storage units is substantially the same over the light reception period of one frame.

(11)
The imaging device of any of (1) to (9), in which the drive unit performs driving so that the exposure time for the electric charge to be transferred to each of the two or more charge storage units becomes longer as the light reception period of one frame elapses.

(12)
A method of driving an imaging device that includes: a pixel region in which pixels are arranged, the pixels each including a photoelectric conversion unit that converts incident light into electric charges through electric conversion and stores the electric charges, and two or more charge storage units that store the electric charges transferred from the photoelectric conversion unit; and a drive unit that drives the pixels,
the method including
repeatedly transferring electric charges with different exposure times from the photoelectric conversion unit to the two or more charge storage units during the light reception period of one frame, the drive unit causing the photoelectric conversion unit to repeatedly transfer electric charges.

(13)
An electronic apparatus including
an imaging device including:
a pixel region in which pixels are arranged, the pixels each including a photoelectric conversion unit that converts incident light into electric charges through electric conversion and stores the electric charges, and two or more charge storage units that store the electric charges transferred from the photoelectric conversion unit; and
a drive unit that drives each pixel to cause the photoelectric conversion unit to repeatedly transfer electric charges with different exposure times to the two or more charge storage units during the light reception period of one frame.

It should be noted that this embodiment is not limited to the above described embodiments, and various modifications may be made to them without departing from the scope of the present disclosure.

REFERENCE SIGNS LIST

1 Imaging device
2 Pixel region
3 Vertical drive circuit
4 Column signal processing circuit
5 Horizontal drive circuit
6 Output circuit
7 Control circuit
11 Pixel
21 PD
22 Charge readout path
23 Anti-blooming gate
31 Transfer gate
32 Charge storage gate
33 Readout gate
34 FD unit
35 Storage capacitor
36 Amplification transistor
37 Select transistor
38 Reset transistor
41 to 43 Gate electrode
44 and 45 Through electrode
51 Gate electrode
52 Through electrode
61 Light shielding film
62 Opening
71 Capacitor
72 Light-shielded HAD
81 On-chip lens
82 Charge storage unit
83 Reset drain

The invention claimed is:

1. An imaging device, comprising:
a pixel region that includes a pixel, wherein the pixel includes:
a photoelectric conversion unit;
a first charge storage unit;
a second charge storage unit;
a first transistor electrically connected between the photoelectric conversion unit and the first charge storage unit, wherein a gate electrode of the first transistor is electrically connected to a gate electrode of the first charge storage unit;
a second transistor electrically connected between the photoelectric conversion unit and the second charge storage unit;
a third transistor electrically connected between the photoelectric conversion unit and a drain; and
a light shielding film that covers the first charge storage unit and the second charge storage unit, wherein
a first electric charge generated in the photoelectric conversion unit is transferred to the first charge storage unit along a first direction, and
a second electric charge generated in the photoelectric conversion unit is transferred to the second charge storage unit along a second direction opposite to the first direction.

2. The imaging device according to claim 1, wherein the pixel further includes:
a floating diffusion unit; and
a readout gate electrically connected between the first charge storage unit and the floating diffusion unit.

3. The imaging device according to claim 2, wherein the pixel further includes a through electrode connected to the floating diffusion unit, and
the through electrode is between a gate electrode of the readout gate and a gate electrode of a reset transistor.

4. The imaging device according to claim 1, wherein a charge storage capacity of the second charge storage unit is different from a charge storage capacity of the first charge storage unit.

5. The imaging device according to claim 1, further comprising a driving circuit configured to control the photoelectric conversion unit to sequentially transfer, in a light reception period of one frame of an image, the first electric charge of a first exposure time to the first charge storage unit and the second electric charge of a second exposure time to the second charge storage unit.

* * * * *